United States Patent
Asano et al.

(10) Patent No.: US 7,655,369 B2
(45) Date of Patent: Feb. 2, 2010

(54) RETICLE SET, METHOD FOR DESIGNING A RETICLE SET, EXPOSURE MONITORING METHOD, INSPECTION METHOD FOR RETICLE SET AND MANUFACTURING METHOD FOR A SEMICONDUCTOR DEVICE

(75) Inventors: Masafumi Asano, Yokohama (JP); Tadahito Fujisawa, Tokyo (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 11/646,480

(22) Filed: Dec. 28, 2006

(65) Prior Publication Data
US 2007/0105028 A1    May 10, 2007

Related U.S. Application Data

(62) Division of application No. 10/725,571, filed on Dec. 3, 2003, now Pat. No. 7,175,943.

(30) Foreign Application Priority Data
Dec. 4, 2002    (JP) ............................ P2002-352819

(51) Int. Cl.
G03C 5/00        (2006.01)
G03F 9/00        (2006.01)
G03F 1/00        (2006.01)
(52) U.S. Cl. ................................ 430/30; 430/5; 430/22
(58) Field of Classification Search ................ 430/5, 430/22, 30
See application file for complete search history.

(56) References Cited

U.S. PATENT DOCUMENTS 5,702,848 A    12/1997    Spence 6,226,074 B1 *  5/2001   Fujisawa et al. ............... 355/53
6,479,196 B2   11/2002   Levenson
6,566,023 B2    5/2003   Wang et al.
6,773,853 B2    8/2004   Minami et al.

FOREIGN PATENT DOCUMENTS

JP         6-204105         7/1994

(Continued)

OTHER PUBLICATIONS

Notice of Grounds for Rejection, issued by Japanese Patent Office, mailed Jun. 21, 2005, for Japanese Patent Application No. P2002-352819, and English-language translation thereof.

Primary Examiner—Mark F Huff
Assistant Examiner—Jonathan Jelsma
(74) Attorney, Agent, or Firm—Finnegan, Henderson, Farabow, Garrett & Dunner, L.L.P.

(57) ABSTRACT

A reticle set, includes a first photomask having a circuit pattern provided with first and second openings provided adjacent to each other sandwiching a first opaque portion, and a monitor mark provided adjacent to the circuit pattern; and a second photomask having a trim pattern provided with a second opaque portion covering the first opaque portion in an area occupied by the circuit pattern and an extending portion connected to one end of the first opaque portion and extending outside the area when the second photomask is aligned with a pattern delineated on a substrate by the first photomask.

7 Claims, 18 Drawing Sheets

FOREIGN PATENT DOCUMENTS

| | | |
|---|---|---|
| JP | 10-207036 | 8/1998 |
| JP | 11-260699 | 9/1999 |
| JP | 2000-310850 | 11/2000 |
| JP | 2001-100392 | 4/2001 |
| JP | 2002-221783 | 8/2002 |
| JP | 2002-299205 | 10/2002 |
| JP | 2003-209049 | 7/2003 |

* cited by examiner

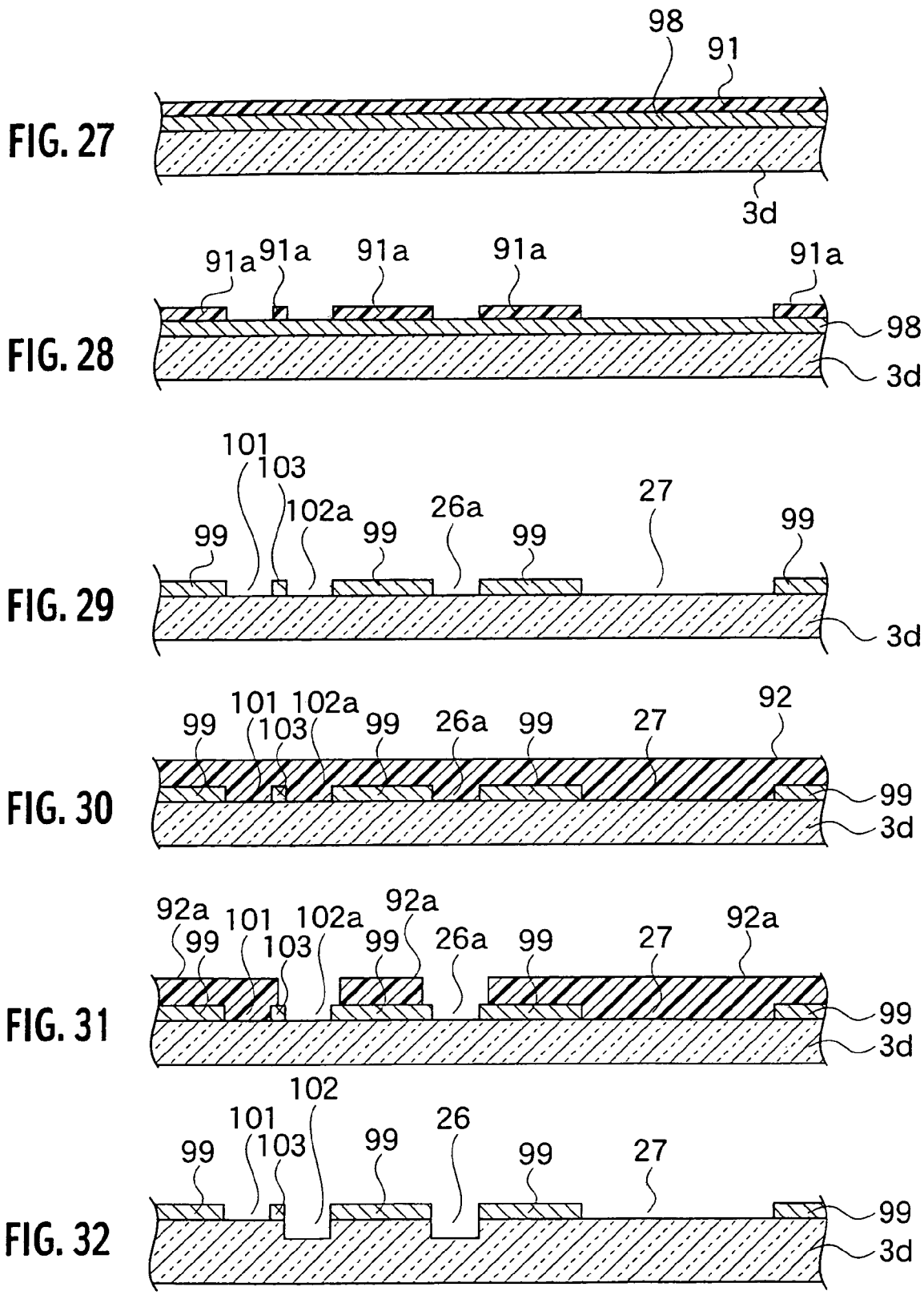

RETICLE SET, METHOD FOR DESIGNING A RETICLE SET, EXPOSURE MONITORING METHOD, INSPECTION METHOD FOR RETICLE SET AND MANUFACTURING METHOD FOR A SEMICONDUCTOR DEVICE

CROSS REFERENCE TO RELATED APPLICATIONS

This is a division of application Ser. No. 10/725,571, filed Dec. 3, 2003 now U.S. Pat. No. 7,175,943, which is incorporated herein by reference.

This application is based upon and claims the benefit of priority from prior Japanese Patent Application P2002-352819 filed on Dec. 4, 2002; the entire contents of which are incorporated by reference herein.

BACKGROUND OF THE INVENTION

1. Field of the Invention

The present invention relates to a reticle set used in a double exposure process, and furthermore, a method of designing the reticle set, a method of monitoring exposure using the reticle set, a method of inspecting the reticle set, and a method of manufacturing a semiconductor device.

2. Description of the Related Art

In recent years, a multiple exposure overlapping a plurality of exposure processes for delineating a specific pattern has attracted attention as one of different types of micro-fabrication technologies. The performance of semiconductor devices greatly depends on the dimensions of the wiring pattern. Therefore, in a process using the multiple exposure, it is required to control precisely parameters for improving accuracy of the dimensions. In the case of using the multiple exposure, exposure conditions are usually determined for each exposure step, and each exposure step for a multiple exposure process is performed based on to conduct multiple exposure the determined exposure conditions.

In a photolithography process, a semiconductor circuit pattern is transferred by use of an aligner on a semiconductor substrate coated with a resist film. In forming a pattern by a reduction projection aligner, the resolution of the aligner is proportional to a wavelength λ of an exposure light and inversely proportional to a numerical aperture NA. Accordingly, responding to the demand of finer dimensions of semiconductor devices, the wavelength of the exposure light has been shortened, the NA of the projection lens has been increased, and process improvement associated therewith has been achieved. However, in order to achieve even finer dimensions of semiconductor devices required in recent years, it is more difficult to assure an exposure latitude and a depth of focus. Therefore, in order to effectively make use of the small exposure margin and improve accuracy of processed dimensions without causing a reduction in production yield, more accurate control of the exposure dose, i.e. the amount of exposure, and the focus is required.

As to the exposure dose control, an exposure dose monitoring method has been proposed. In this method, exposure is performed so as to have an inclined distribution of the exposure doses on a substrate, using a reticle set having patterns therein with dimension ratios of transparent portions to opaque portions continuously changed in one direction by a pitch that cannot resolve images on the substrate by a reduction projection aligner (refer to Japanese Patent Laid-Open Application No. 2000-310850). Furthermore, as to the focus control, a method has been proposed in which focus is monitored using focus monitor patterns having a rhombus feature, that shift the exposure light in phase from each other to show different characteristics of pattern dimension for defocus (refer to Japanese Patent Laid-Open Application No. 2001-100392).

As described above, in micro-fabrication it is important to control exposure conditions for photolithography with high accuracy in order to achieve processing accuracy and uniformity in pattern dimensions of semiconductor devices. Therefore, it is necessary to provide many types of monitor marks such as an alignment mark, a dimension monitor mark, an exposure dose monitor mark and a focus monitor mark in the exposure area so that a large amount of data can be acquired and analyzed. However, in a reticle set on which a high density semiconductor circuit pattern has been delineated, the monitor marks are disposed only in limited areas such as scribe lines because of restrictions on layout. Accordingly, in an actual semiconductor integrated circuit manufacturing process, it is difficult to acquire detailed information on positions and dimensions over the entire exposure area. As described above, currently used configuration of monitor marks are an obstacle to the improvement of accuracy in micro-fabrication.

SUMMARY OF THE INVENTION

A first aspect of the present invention inheres in a reticle set including a first photomask having a circuit pattern provided with first and second openings provided adjacent to each other sandwiching a first opaque portion, and a monitor mark provided adjacent to the circuit pattern; and a second photomask having a trim pattern provided with a second opaque portion configured to cover the first opaque portion in an area occupied by the circuit pattern and an extending portion connected to one end of the first opaque portion and configured to extend outside the area occupied by the circuit pattern when the second photomask is aligned with a pattern delineated on a substrate by the first photomask.

A second aspect of the present invention inheres in a method for designing a reticle set including forming in a first photomask, a circuit pattern having first and second openings provided adjacent to each other sandwiching a first opaque portion, and a monitor mark adjacent to the circuit pattern; and forming in a second photomask, a trim pattern having a second opaque portion configured to cover the first opaque portion in an area occupied by the circuit pattern and an extending portion connected to one end of the first opaque portion and configured to extend outside the area occupied by the circuit pattern when the second photomask is aligned with a pattern delineated on a substrate by the first photomask.

A third aspect of the present invention inheres in an exposure monitoring method including delineating a wiring resist mask of a photoresist film by transferring a narrow line portion of a wiring of a circuit by a first exposure step; delineating a monitor resist pattern of the photoresist film by transferring an exposure monitor mark configured to measure an exposure condition near the wiring resist mask at a position in an area where the wiring is to be delineated, the position being exposed by a second exposure step; and measuring the exposure condition for the first exposure step by the monitor resist pattern.

A fourth aspect of the present invention inheres in an inspection method for a reticle set including delineating a circuit pattern and an inspection monitor mark on a resist film coated on an opaque material film on a transparent substrate to form a resist mark; etching the opaque material film by use of the resist mark to form a first photomask in which the circuit pattern has first and second openings provided adjacent to each other sandwiching a first opaque portion, and the inspection monitor mark provided adjacent to the circuit pattern; and inspecting the first photomask by use of the inspection monitor mark.

A fifth aspect of the present invention inheres in a manufacturing method for a semiconductor device including coating a first photoresist film on an underlying film on a semiconductor substrate; transferring a circuit pattern having first and second openings provided adjacent to each other sandwiching a first opaque portion and a monitor mark adjacent to the circuit pattern onto the first photoresist film from a first photomask by a first exposure step so as to delineate a wiring resist mask and a monitor resist pattern; selectively removing the underlying film by using the wiring resist mask and the monitor resist pattern as a mask so as to delineate a narrow line portion of a wiring of a circuit and a monitor underlying film; coating a second photoresist film on the semiconductor substrate on which the narrow line portion and the monitor underlying film is formed; delineating a trim resist mask by transferring a trim pattern from a second photomask onto the second photoresist film by a second exposure step, the trim pattern having a second opaque portion covering the first opaque portion in an area occupied by the circuit pattern, and an extending portion connected to one end of the first opaque portion and extending outside the area occupied by the circuit pattern; and delineating the wiring by selectively removing the monitor underlying film using the trim resist mask.

A sixth aspect of the present invention inheres in a manufacturing method for a semiconductor device including coating a photoresist film on a underlying film on a semiconductor substrate; transferring a circuit pattern having first and second openings provided adjacent to each other sandwiching a first opaque portion and a monitor mark provided adjacent to the circuit pattern onto the photoresist film from a first photomask by a first exposure step so as to delineate a wiring resist latent image and a monitor resist latent image; projecting a trim pattern by a second exposure step from a second photomask onto the photoresist film exposed by the first exposure step, the trim pattern having a second opaque portion covering the first opaque portion in an area occupied by the circuit pattern, and an extending portion connected to one end of the first opaque portion and extending outside the area occupied by the circuit pattern; and delineating a wiring resist mask by a development process.

BRIEF DESCRIPTION OF DRAWINGS

FIGS. 27 to 32 are examples of the cross-sectional views for explaining the fabrication process for the first photomask according to the third embodiment of the present invention.

DETAILED DESCRIPTION OF THE INVENTION

Figure 1A:
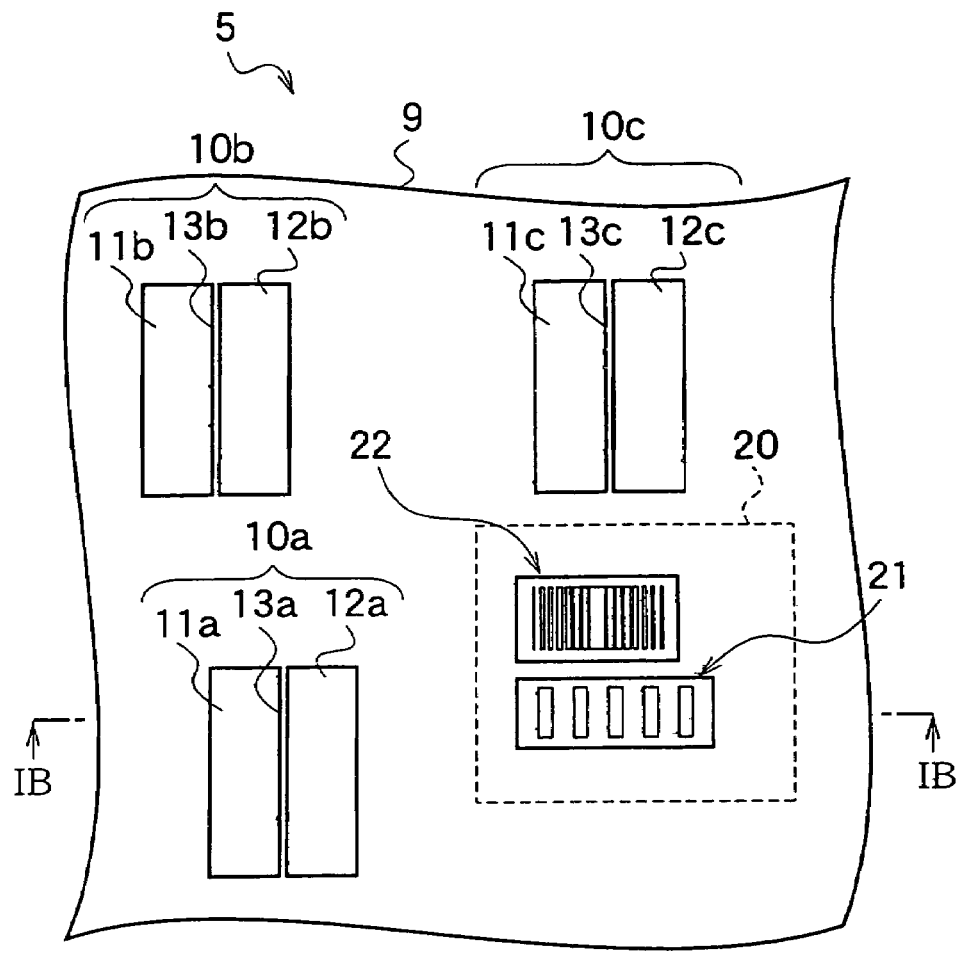
FIGS. 1A and 1B are schematic views showing an example of a first photomask according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

For a multiple exposure according to a first embodiment of the present invention, a double exposure will be described where an alternating phase shift mask and a trim mask are used together. The double exposure includes exposing a circuit pattern by the alternating phase shift mask having a high resolution but having a restriction on a circuit layout and deleting an unnecessary pattern for the given circuit layout with a trim pattern.

Figure 1B:
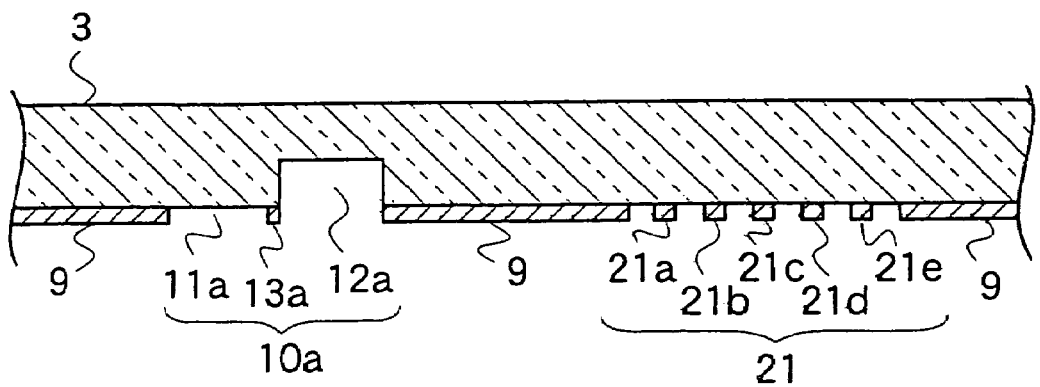
Figure 2A:
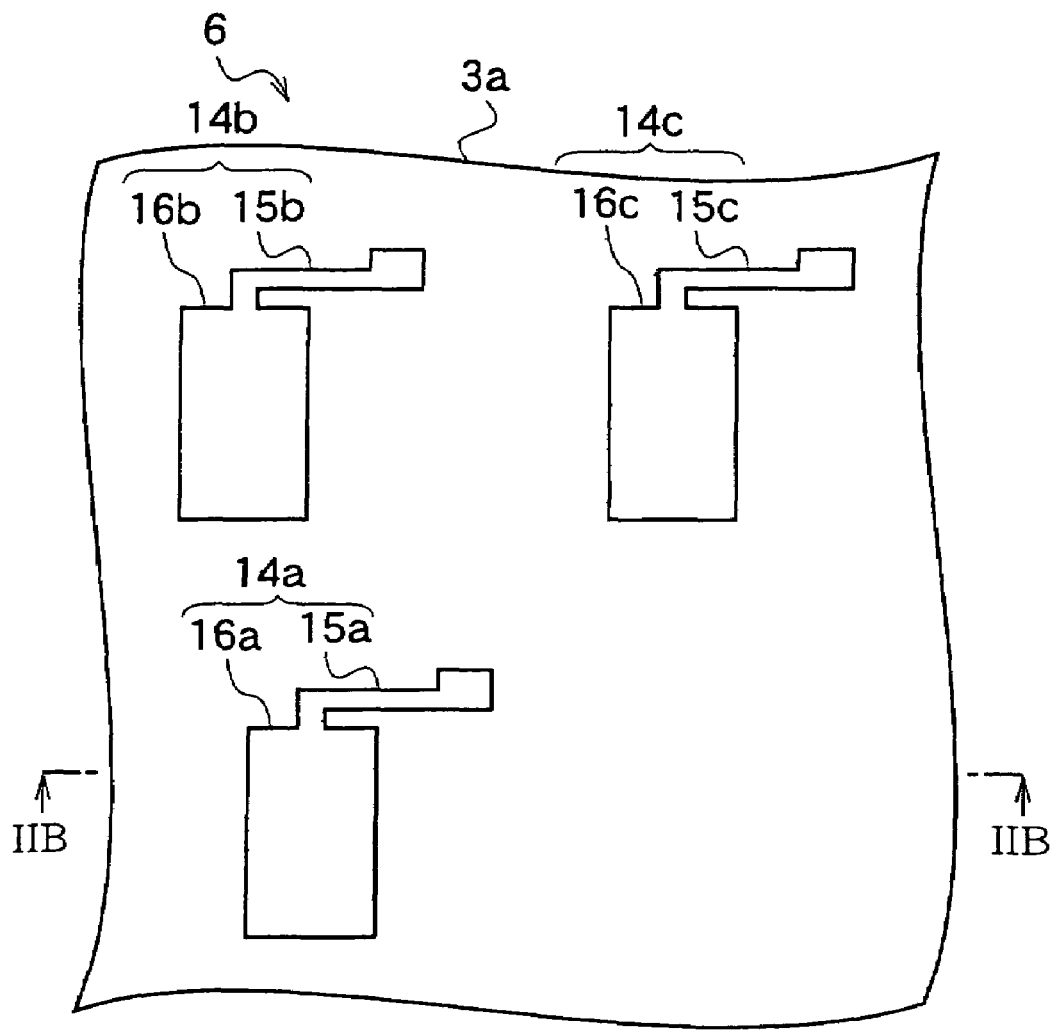
FIGS. 2A and 2B are schematic views showing an example of a second photomask according to the first embodiment of the present invention.
Figure 2B:
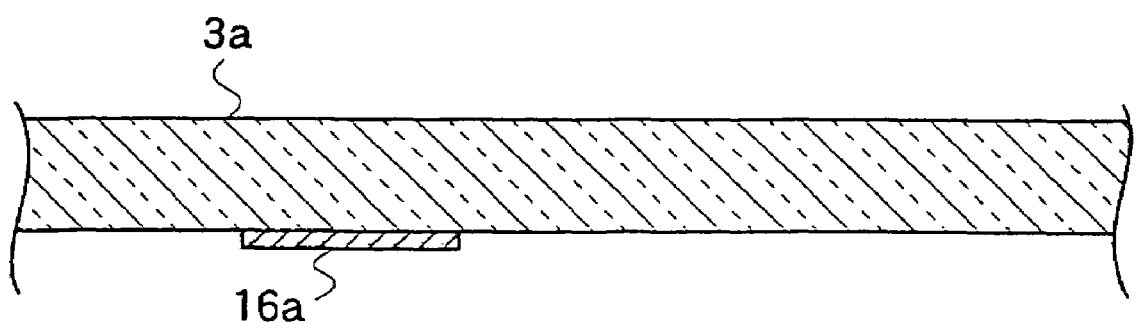

In the reticle set according to the first embodiment of the present invention, alternating phase shift masks for printing circuit patterns 10a to 10c on a semiconductor wafer are disposed on a first photomask 5 configured to be used in a first exposure step as shown in FIGS. 1A and 1B, and trim patterns 14a to 14c are disposed on a second photomask 6 configured to be used in the second exposure step as shown in FIGS. 2A and 2B. In a corresponding area of the first photomask 5 on which another circuit pattern is scheduled to be printed on the semiconductor wafer in a later process, a monitor mark section 20 is also provided and includes various exposure monitor marks.

The first photomask 5 has, as shown in FIG. 1A, an opaque film 9 shielding an exposure light, including a metal film such as chrome (Cr) or a metal compound film such as chrome oxide ($Cr_2O_3$) provided on the surface of a transparent substrate 3 of synthetic quartz and the like. For example, circuit patterns 10a to 10c, which may include gate wiring patterns of semiconductor devices have first rectangular shaped openings 11a to 11c, second rectangular shaped openings 12a to 12c, and first line shaped opaque portions 13a to 13c between the first openings 11a to 11c and the second openings 12a to 12c. A dimension monitor mark 21 configured to monitor the dimensions of exposed patterns, an exposure dose monitor mark 22 configured to monitor the exposure dose, and the like are arranged in the monitor mark section 20.

The circuit patterns 10a to 10c are alternating phase shift masks. As shown in FIG. 1B, which is a cross-sectional view taken along the line IB-IB of the first photomask 5 in FIG. 1A, in the circuit pattern 10a for example, the second opening 12a implemented by a trench in the transparent substrate 3 through the opaque film 9, shifts the phase by 180° relative to exposure light passing through the first opening 11a. Hence, when the first opaque portion 13a is transferred onto a semiconductor substrate by the exposure light transmitting the first opening 11a and the second opening 12a, diffracted light beams under the opaque portion 13a are canceled out, and thereby the pattern is resolved on the semiconductor substrate. The dimension monitor mark 21 having opaque portions 21a to 21e, and the like, arranged as a lattice, are positioned near the circuit pattern 10a.

The second photomask 6, as shown in the plan view of FIG. 2A and the cross-sectional view of FIG. 2B, which is taken along the line IIB-IIB in FIG. 2A, has the trim patterns 14a to 14c of an opaque material film including a metal film such as Cr or a metal compound film such as $Cr_2O_3$ provided on the surface of a transparent substrate 3a such as a synthetic quartz substrate. The trim patterns 14a to 14c respectively include extending portions 15a to 15c to be part of the wiring and second opaque portions 16a to 16c connected with the extending portions 15a to 15c. The pattern widths of the second opaque portions 16a to 16c are designed to be sufficiently wider than the dimension of the resolution limit of an aligner. Here, the dimension of the resolution limit is expressed as $\lambda\{NA*(1+\sigma)\}$, where $\lambda$ is an exposure light wavelength, NA is a numerical aperture of a projection lens, and $\sigma$ is a coherence factor of an illumination optical system.

Figure 3:
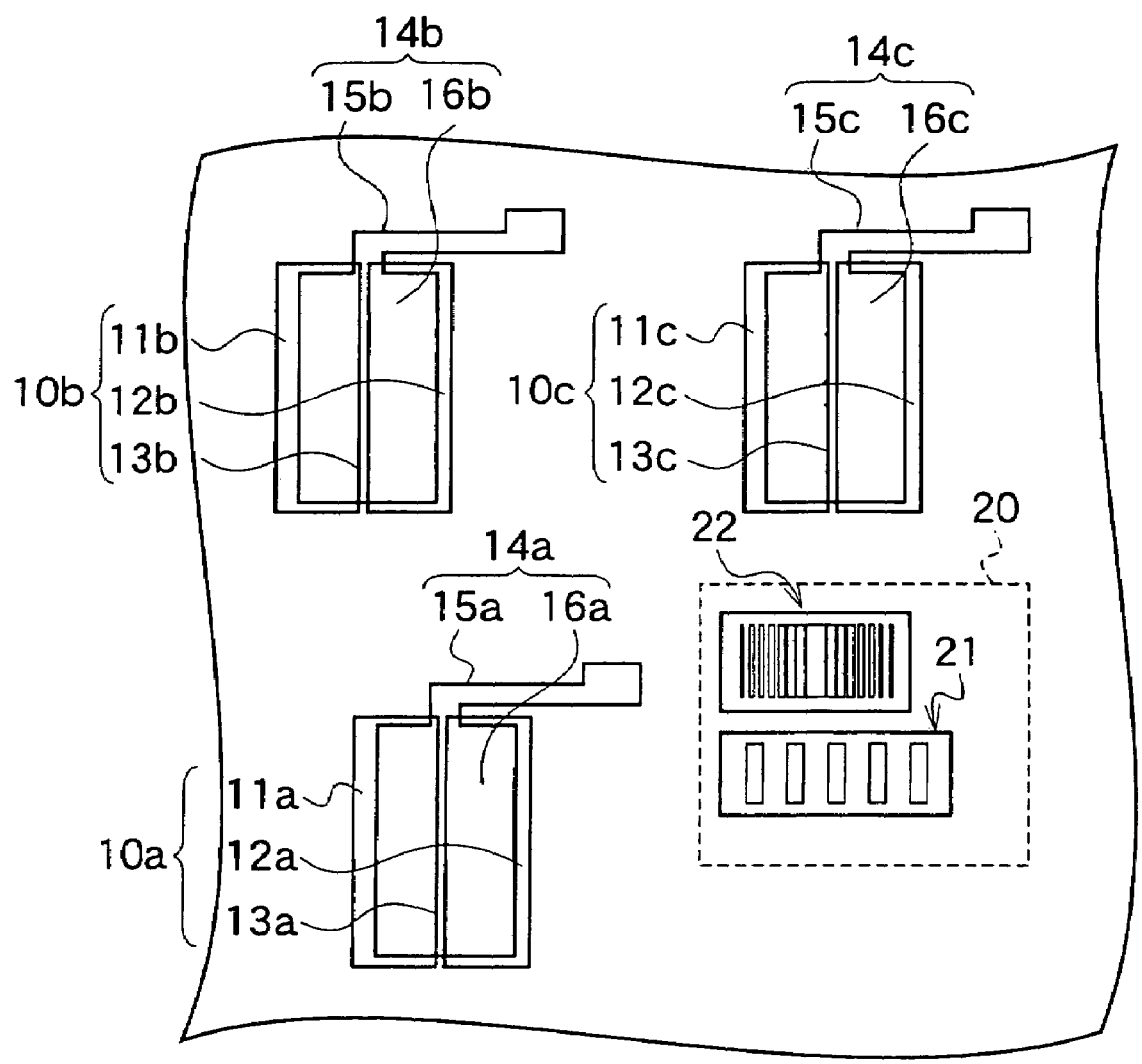
FIG. 3 is a view showing an example of overlay of the first and second photomasks in a double exposure process according to the first embodiment of the present invention.

An overlay of the first photomask 5 and the second photomask 6 will be described with reference to FIG. 3. As shown in FIG. 3, the first opaque portions 13a to 13c are aligned so as to be fitted to and covered by the second opaque portions 16a to 16c of the trim patterns 14a to 14c. The outer edges of the second opaque portions 16a to 16c are designed to be within areas surrounded by the outer edges of the first and second openings 11a to 11c, and 12a to 12c of the circuit patterns 10a to 10c. Moreover, the extending portions 15a to 15c of the trim patterns 14a to 14c are designed to overlap respectively with end lines of the first opaque portions 13a to 13c. The monitor mark section 20 including the dimension monitor mark 21, the exposure dose monitor mark 22, and the like is positioned near the circuit patterns 10a to 10c and the trim patterns 14a to 14c so as not to overlap the circuit patterns 10a to 10c and the trim patterns 14a to 14c.

According to the reticle set of the first embodiment of the present invention, patterns formed on the semiconductor wafer by transferring the various exposure monitor marks positioned in the monitor mark section 20 in the first exposure process are exposed and removed in the second exposure process. Therefore, on the first photomask 5, a large number of various exposure monitor marks can be positioned over the entire exposure area near the circuit patterns 10a to 10c with no restriction of the circuit layout. Thereby, detailed information of the positions and dimensions in the entire exposure area on the semiconductor wafer where the semiconductor devices are fabricated can be acquired, so that exposure conditions can be controlled with high accuracy in the double exposure process.

Figure 4:
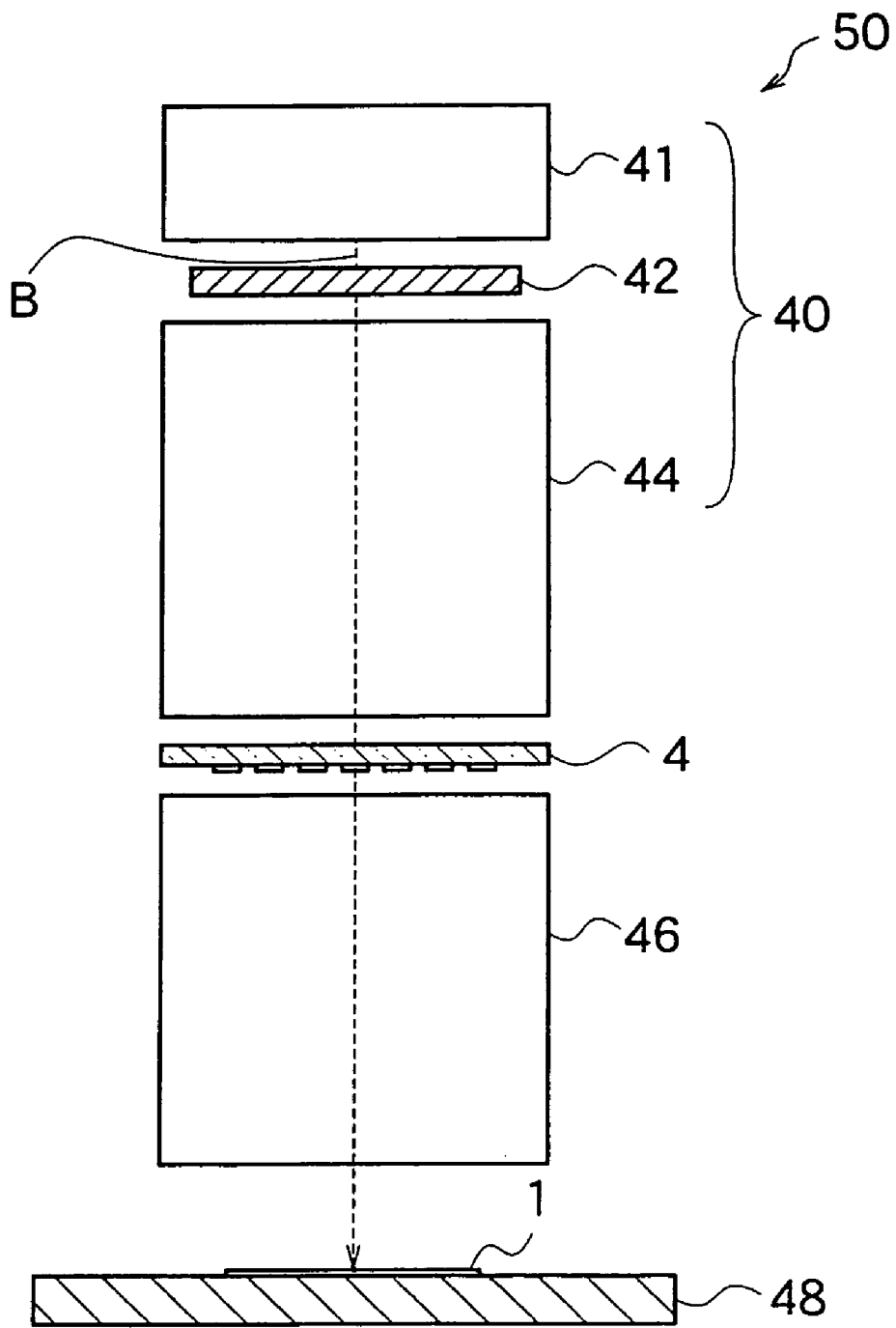
FIG. 4 is a schematic view of an aligner used in explaining the double exposure process.

An aligner 50 used in the description of the double exposure process of the first embodiment of the present invention is a reduction projection aligner (stepper) having a reduction ratio of ¼ as shown in FIG. 4. A light source 41, a shutter 42, and an illumination lens system 44 implement an illumination optical system 40. A krypton fluoride (KrF) excimer laser having a wavelength $\lambda$ of 248 nm, is used as the light source 41. The illumination lens system 44 includes a fly eye lens and a condenser lens. A coherence factor $\sigma$ representing the interference characteristic of the illumination optical system 40 is 0.75. A projection optical system 46 includes a projection lens and an aperture stop. The numerical aperture NA of the projection lens is 0.68. By an exposure light B, the pattern of a reticle 4 of the reticle set provided between the illumination optical system 40 and the projection optical system 46 is demagnified and projected onto a semiconductor wafer (semiconductor substrate) 1 on a stage 48. The reticle 4 is either the first photomask 5 or the second photomask 6. The reticle set can be implemented by, for example, a single reticle in which the first and second photomasks 5, 6 are disposed respectively in two divided areas of the reticle 4. Alternatively, the reticle set may have the first and second photomasks 5, 6 disposed on respective transparent substrates. The exposure area per shot is about 23 by 30 mm square. Here, the "shot" is defined as a single event of light illumination to a predetermined exposure area on the substrate. While the reduction ratio of the aligner 50 is of ¼ for the sake of convenience in description, any reduction ratio can be used, as a matter of course. In the description below, the pattern dimension on the reticle 4 will be described in terms of a dimension demagnified and projected on the semiconductor substrate 1 unless otherwise noted.

Figure 5A:
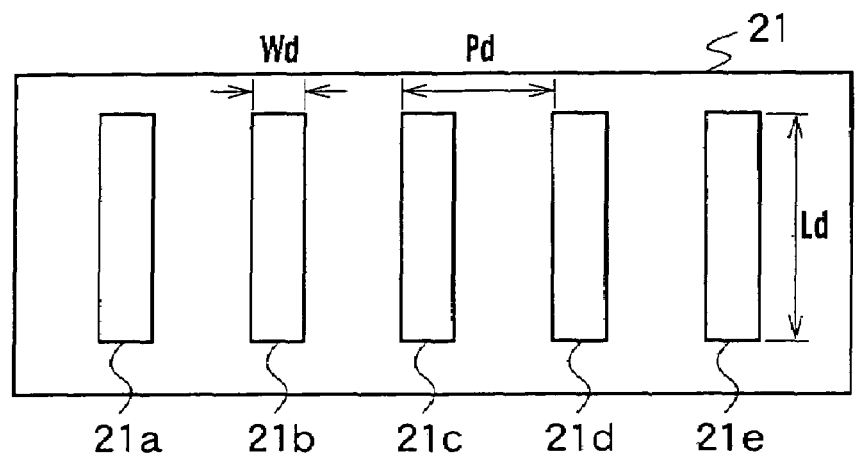
FIGS. 5A and 5B are schematic views showing an example of a dimension monitor mark according to the first embodiment of the present invention.
Figure 5B:
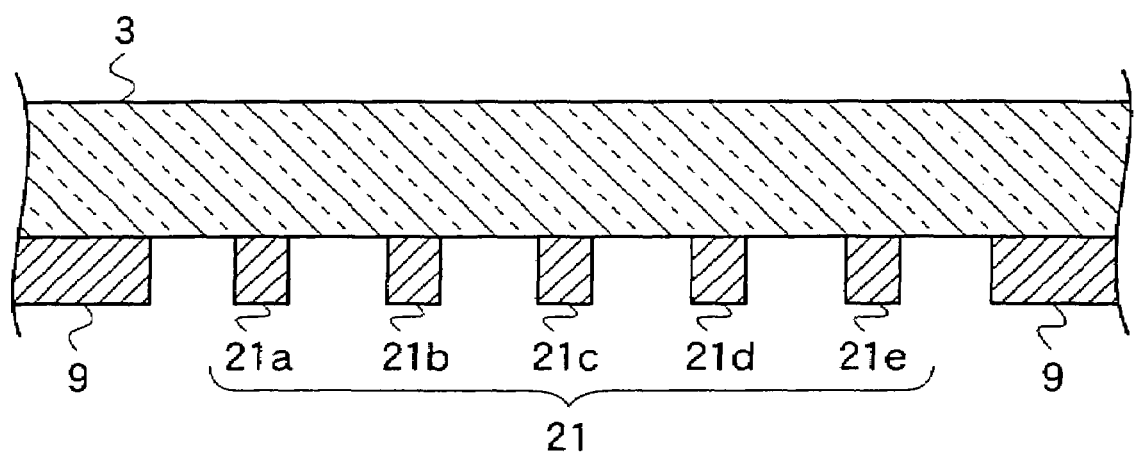

Next, various exposure monitor marks disposed in the monitor mark section 20 of the first photomask 5 will be described. The dimension monitor mark 21, as shown in the plan view of FIG. 5A and the cross-sectional view of FIG. 5B, has stripe shaped opaque portions 21a to 21e having, for example, a length Ld of 1 µm and a width Wd of 110 nm arranged on the surface of the transparent substrate 3 at a pitch of 330 nm. A resist pattern, formed by transferring the opaque portions 21a to 21e of the dimension monitor mark 21, is measured with a scanning electron microscope (SEM) and the like, to monitor transferred dimensions on a photoresist film.

Figure 6A:
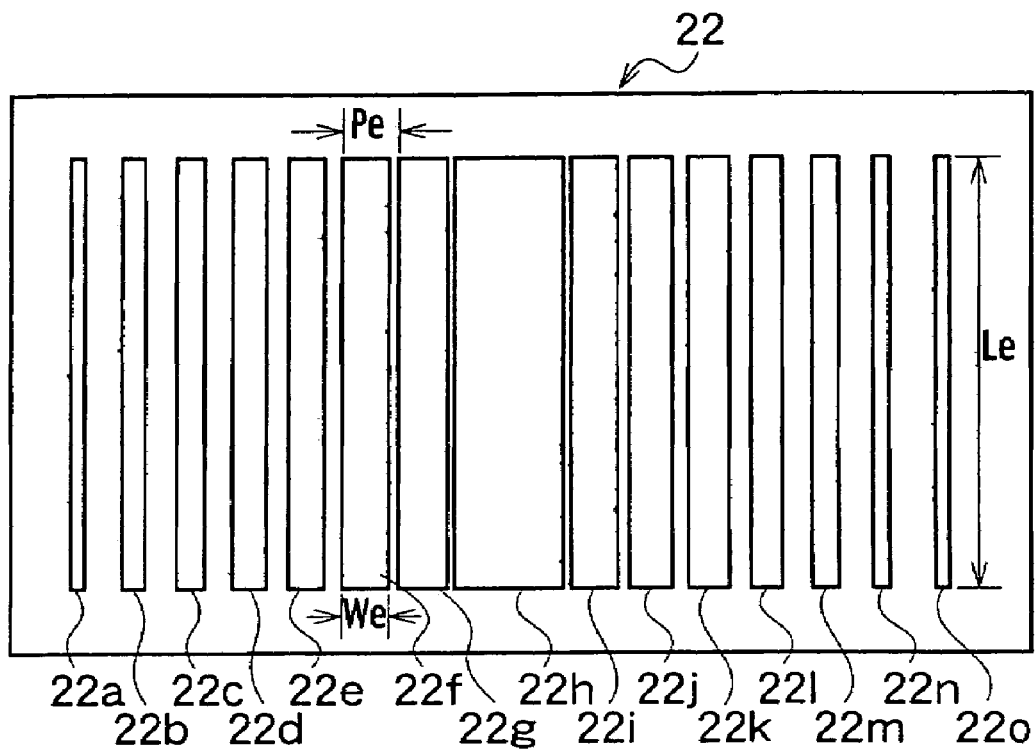
FIGS. 6A and 6B are schematic views showing an example of an exposure dose monitor mark according to the first embodiment of the present invention.
Figure 6B:
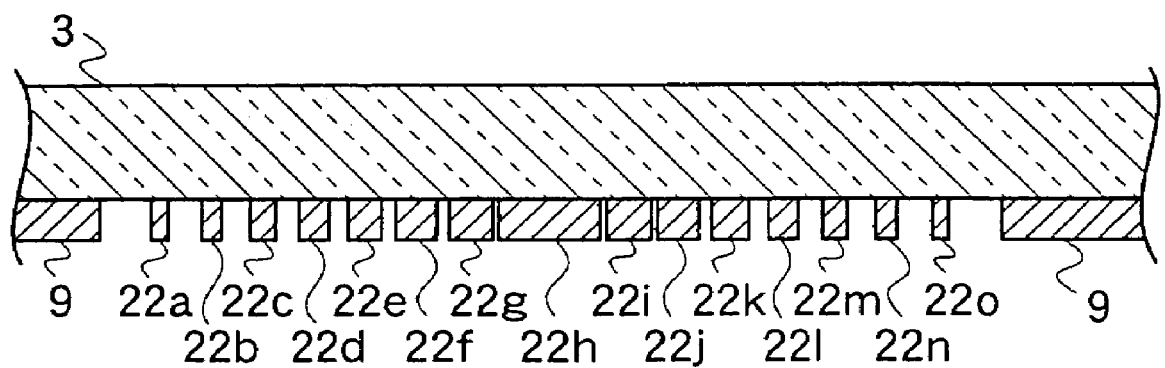

The exposure dose monitor mark 22, as shown in the plan view of FIG. 6A and the cross-sectional view of FIG. 6B, is a diffraction grating where a plurality of opaque portions 22a to 22o on the transparent substrate 3 have a length Le of 2 µm and widths We varying incrementally at a constant rate such that the opening ratio varies continuously. Here, the left ends of the respective features are arranged periodically at a fixed pitch Pe of 190 nm. The opening ratio increases in the direction of both the right side and left side of the opaque film 22h at the center of the exposure dose monitor mark 22 in the drawing. The opening ratio of the opaque film 22h at the center is 0%, and the opening ratios of the opaque films 22a and 22*o* at the left and right ends are maximum and close to 100%. When the pitch Pe is not greater than the resolution limit of the aligner 50, the exposed diffraction grating pattern is not resolved on the semiconductor substrate 1. In the case of the aligner 50 (λ: 248 nm, NA: 0.68, σ: 0.75) used in the first embodiment of the present invention, the resolution limit is about 208 nm. Since the pitch Pe is not greater than the resolution limit, the patterns of the opaque portions 22*a* to 22*o* are not resolved. The intensities of the exposure light diffracted and passing between the opaque portions 22*a* to 22*o* vary with the opening rate. A resist pattern obtained by exposing the exposure dose monitor mark 22 has tilted sidewalls formed at the left and right ends of the exposure dose monitor mark 22 according to the sensitivity curve of the exposed photoresist film. Furthermore, the left and right ends of the exposure dose monitor mark 22 are demagnified according to the exposure dose so as to shrink the width. The exposure dose can be monitored using the amount of shrinkage of the pattern width obtained from measurement of the pattern width of the transferred exposure dose monitor mark 22.

In the double exposure process of the first embodiment of the present invention, the monitor mark section 20 including the exposure monitor marks such as the dimension monitor mark 21 and the exposure dose monitor mark 22 are disposed near the circuit patterns 10*a* to 10*c* of the first photomask 5. Moreover, transferred patterns of exposure monitor marks of the monitor mark section 20, formed by being shielded from the light in the first exposure step are exposed through the second photomask 6 in the second exposure step. Hence, only a transferred pattern of the circuit patterns 10*a* to 10*c* shielded from the light by the trim patterns 14*a* to 14*c* of the second photomask 6 in the second exposure step is left. Therefore, on the first photomask 5, a large number of various exposure monitor marks can be provided over the entire exposure area near the circuit patterns 10*a* to 10*c* with no restriction on the layout of the circuit patterns. Thereby, detailed information on positions and dimensions over the entire exposure area where the semiconductor devices are formed can be acquired, so that exposure conditions can be controlled with high accuracy in the double exposure process.

Next, the double exposure process of the first embodiment of the present invention will be described using the cross-sectional view of FIG. 1B taken along the line IB-IB in FIG. 1A as an example, with reference to the cross-sectional views in FIGS. 7 to 12.

Figure 7:
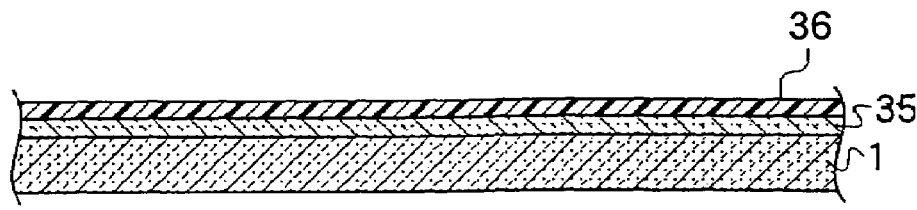
FIGS. 7 to 12 are examples of the cross-sectional views for explaining the double exposure process according to the first embodiment of the present invention.

(a) First, as shown in FIG. 7, an underlying film 35 such as a polysilicon film is deposited on a semiconductor substrate 1 to have a thickness of 200 nm, and a first positive-type photoresist film 36 is spin-coated on the underlying film 35 to have a thickness of 600 nm.

Figure 8:
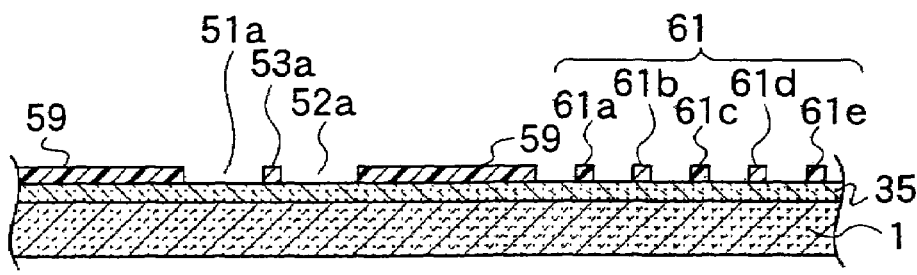

(b) In the first exposure step, a pattern of the first photomask 5 is projected onto the first photoresist film 36 on the surface of the semiconductor substrate 1 using the aligner 50 (see FIG. 4). After a development process, as shown in FIG. 8, a wiring resist mask 53*a* having a line feature sandwiched by the first and second resist opening portions 51*a* and 52*a* in resist masks 59 is delineated by transferring the circuit pattern 10*a* having the first and second openings 11*a* and 12*a* positioned adjacent to each other sandwiching the first opaque portion 13*a* in FIG. 1. Furthermore, the dimension monitor resist pattern 61 including the dimension monitor resist masks 61*a* to 61*e* is delineated by transferring the opaque portions 21*a* to 21*e* of the dimension monitor mark 21 shown in FIGS. 5A and 5B.

Figure 9:
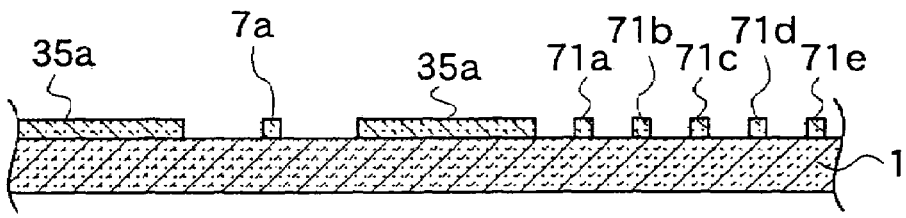

(c) Next, using the resist masks 59, a wiring resist mask 53*a*, and the dimension monitor resist masks 61*a* to 61*e* as masks, the underlying film 35 is selectively removed by an anisotropic reactive ion etching method (RIE) and the like, as shown in FIG. 9, to form underlying films 35*a*, a narrow line portion 7*a* of a wiring underlying film, and dimension monitor underlying film 71*a* to 71*e*.

Figure 10:
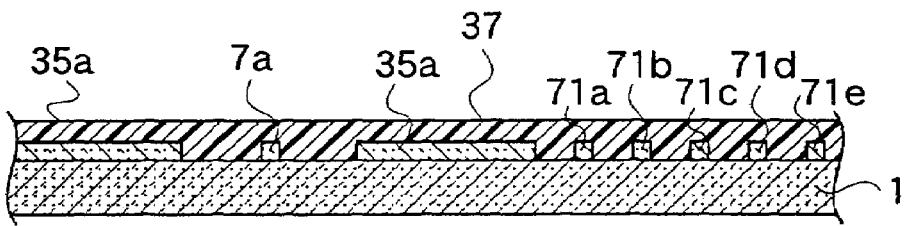

(d) Subsequently, as shown in FIG. 10, a second positive-type photoresist film 37 is coated to have a thickness of 600 nm on the underlying films 35*a*, the narrow line portion 7*a*, and the dimension monitor underlying films 71*a* to 71*e*.

Figure 11:
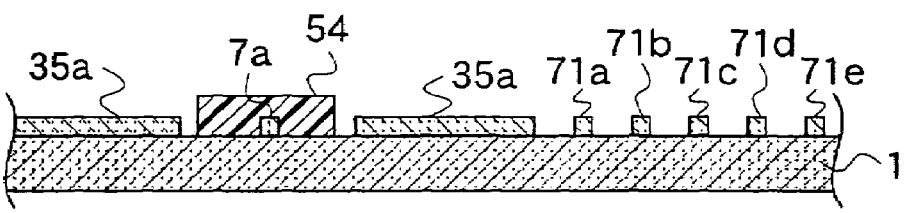

(e) In the second exposure step, a pattern of the second photomask 6 of FIG. 2 is projected onto the second photoresist film 37 using the aligner 50. As shown in FIG. 3, the projected pattern of the second photomask 6 overlays the transferred pattern of the first photomask 5. The trim pattern 14*a* is transferred in an area occupied by the circuit pattern 10*a* of the first photomask 5. The trim pattern 14*a* has the second opaque portion 16*a* covering the first opaque portion 13*a* and the extending portion 15*a* overlapping one end of the first opaque portion 13*a* and extending outside the area occupied by the circuit pattern 10*a*. After a development process, as shown in FIG. 11, a trim resist mask 54 is delineated covering the narrow line portion 7*a*. Although not shown in FIG. 11, the trim resist mask 54 has a resist pattern formed thereon, corresponding to the extending portion 15*a* of the trim pattern 14*a* and connected with one end in the longitudinal direction of the narrow line portion 7*a*.

Figure 12:
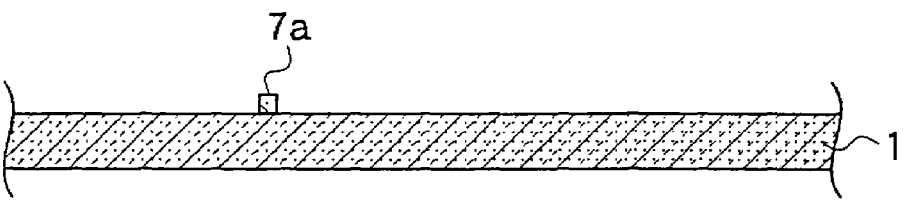

(f) Thereafter, the underlying film 35*a* is selectively removed by RIE using the trim resist mask 54 as a mask. Here, since no resist mask is formed on the dimension monitor underlying film 71*a* to 71*e*, the narrow line portion 7*a* is left on the semiconductor substrate 1 as shown in FIG. 12. In FIG. 12, only the narrow line portion 7*a* delineated by transferring the circuit pattern 10*a* is shown. However, other narrow line portions 7*b*, 7*c* delineated by transferring the circuit patterns 10*b*, 10*c* are also left on the semiconductor substrate 1.

Figure 13:
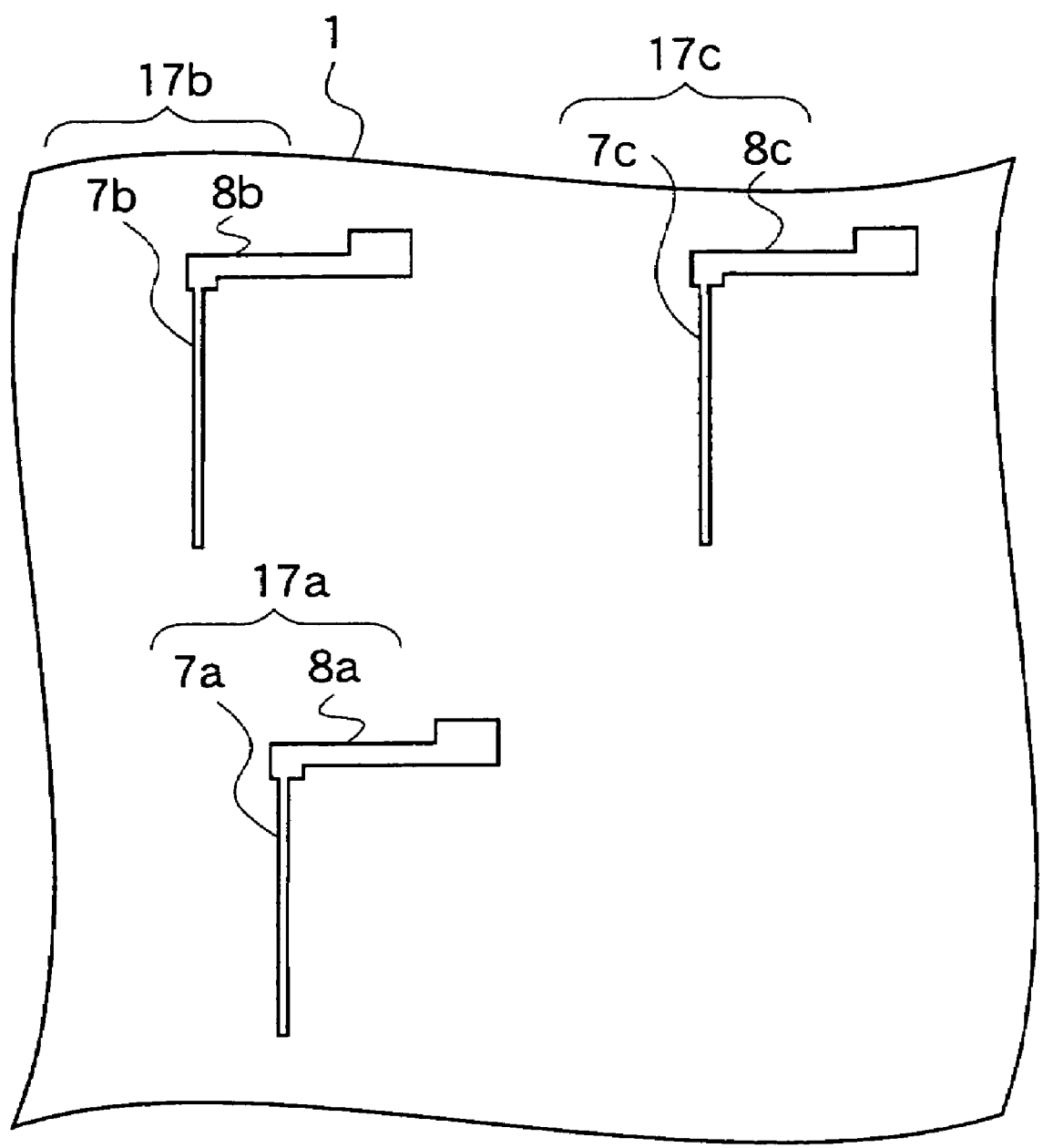
FIG. 13 is a schematic view showing an example of a wiring pattern formed by the double exposure process according to the first embodiment of the present invention.

By the above double exposure process, as shown in FIG. 13, an overlapping portion (see FIG. 3) of the patterns of the first and second photomasks 5 and 6 is left on the semiconductor substrate 1 to delineate wirings 17*a* to 17*c* corresponding to the gate electrodes of field effect transistors (FET), for example. The wirings 17*a* to 17*c* have respectively narrow line portions 7*a* to 7*c* corresponding to gate wirings, and wiring extending portions 8*a* to 8*c* connected to the respective ends of the narrow line portions 7*a* to 7*c* and corresponding to contact portions for the gate wirings. The wiring extending portions 8*a* to 8*c* are delineated by selectively etching the underlying film 35*a* using a part of the trim resist mask 54 that is a resist pattern corresponding to the extending portion 15*a* of the trim pattern 14*a* on the second photomask 6, as a mask. Because a resist pattern delineated by transferring the exposure monitor mark monitor mark section 20 is removed after the second exposure step, the monitor mark can be provided in an area where other wirings of a circuit are to be delineated in a later process.

Figure 14:
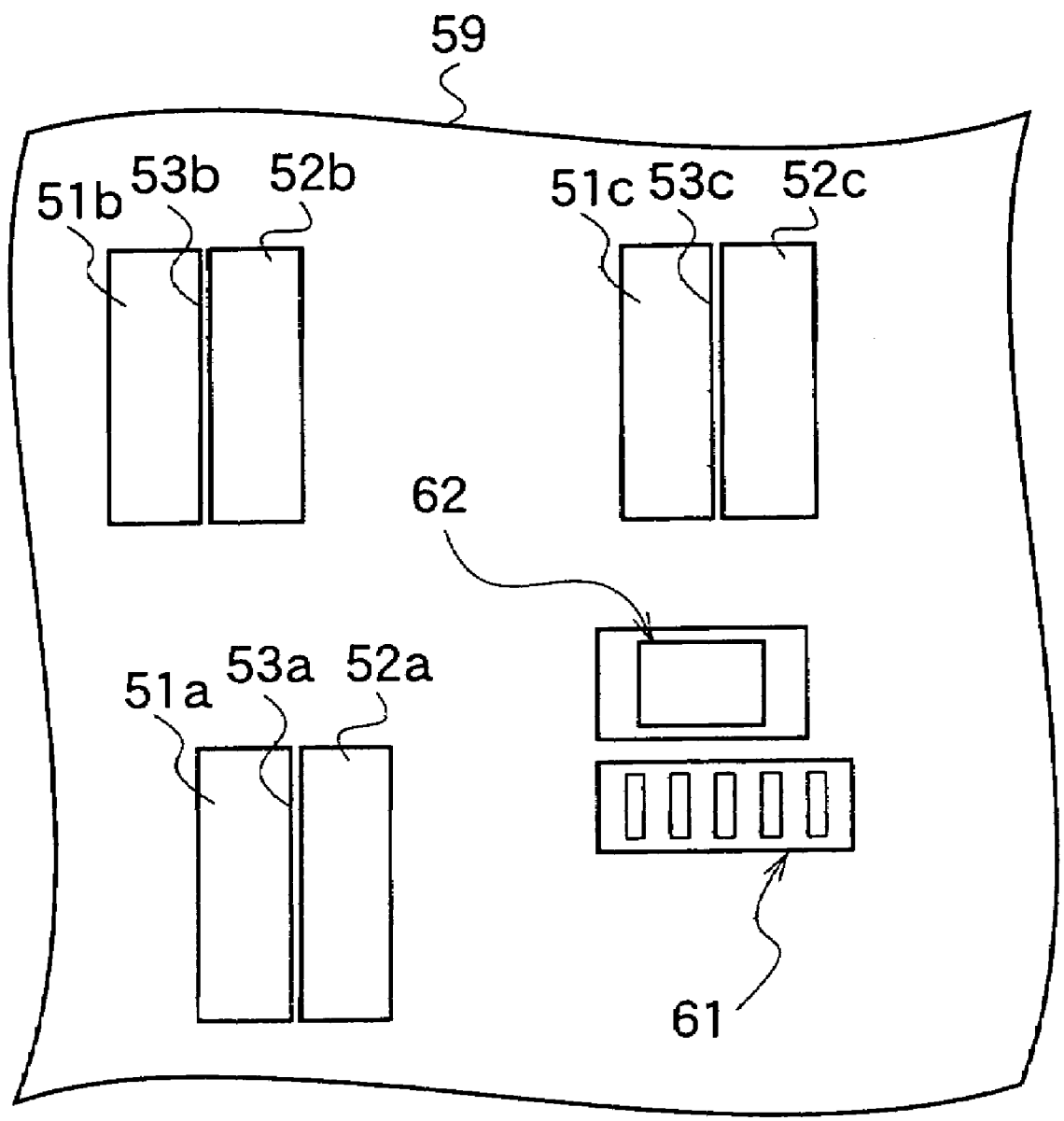
FIG. 14 is a schematic view showing an example of a resist mask formed by a first exposure step of the double exposure process according to the first embodiment of the present invention.

In the monitoring method using the double exposure process of the first embodiment of the present invention, as shown in FIG. 14, the circuit patterns 10*a* to 10*c* are transferred in the first exposure step, and in the resist mask 59, the wiring resist masks 53*a* to 53*c* between the first and second resist opening portions 51*a* to 51*c* and 52*a* to 52*c* are delineated. The dimension monitor resist pattern 61, an exposure dose monitor resist pattern 62, and the like are delineated by transferring the dimension monitor mark 21, the exposure dose monitor mark 22, and the like of the monitor mark section 20. The pattern dimensions of the wiring resist masks 53*a* to 53*c*, the dimension monitor resist pattern 61, the exposure dose monitor resist pattern 62, and the like are measured over the entire exposed area of the semiconductor substrate 1. For example, it is shown that the line width variation of the wiring resist masks 53a to 53c in the surface of the semiconductor substrate 1 depends on the defocus variation based on comparison with the variations in the surface of the transferred resist pattern of the various monitor marks.

Thus, according to the first embodiment of the present invention, a large number of the various exposure monitor marks can be provided over the entire exposure area near the circuit patterns 10a to 10c on the first photomask 5 with no restriction on layout of the circuit patterns. Thereby, detailed information on positions and dimensions over the entire exposure area where the semiconductor devices are fabricated can be provided, so that exposure conditions can be controlled with high accuracy in the double exposure process.

Second Embodiment

Figure 15:
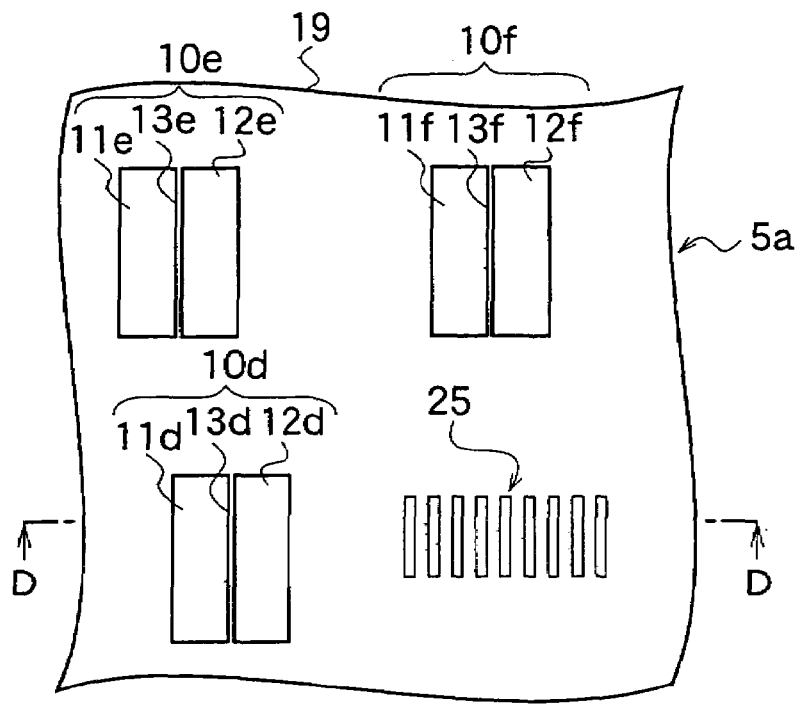
FIG. 15 is a schematic view showing an example of a first photomask according to a second embodiment of the present invention.
Figure 16:
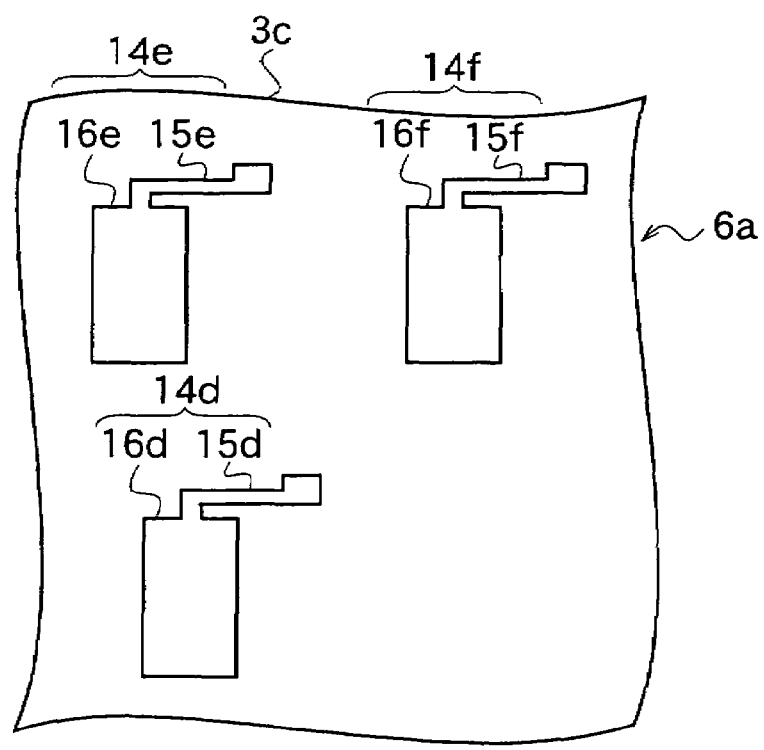
FIG. 16 is a schematic view showing an example of a second photomask according to the second embodiment of the present invention.

In a reticle set used for a double exposure according to a second embodiment of the present invention, as shown in FIGS. 15 and 16, alternating phase shift masks for printing circuit patterns 10d to 10f on a semiconductor wafer are provided on a first photomask 5a configured to be used in the first exposure step, and trim patterns 14d to 14f are provided on a second photomask 6a configured to be used in the second exposure step. In a corresponding area of the first photomask 5a on which another circuit pattern is scheduled to be printed on the semiconductor wafer in a later process, an alignment mark 25 is provided. The alignment mark 25 is disposed adjacent to the circuit patterns 10d to 10f of the first photomask 5a and the trim patterns 14d to 14f of the second photomask 6a so as not to overlap with the circuit patterns 10d to 10f and the trim patterns 14d to 14f. The reticle set according to the second embodiment is different from that of the first embodiment in that the alignment mark 25 is used as a monitor mark, and the rest of the configurations are the same as the first embodiment, and thus duplicated description is omitted.

As shown in FIG. 15, the circuit patterns 10d to 10f, which are patterns of, for example, gate wirings of semiconductor devices and provided on the first photomask 5a, have rectangular-shaped first openings 11d to 11f and second openings 12d to 12f that are provided on an opaque film 19, as well as line-shaped opaque portions 13d to 13f between the first openings 11d to 11f and the second openings 12d to 12f.

The second photomask 6a, as shown in FIG. 16, has trim patterns 14d to 14f made of an opaque material film provided on the surface of a transparent substrate 3c. The trim patterns 14d to 14f respectively include second opaque portions 16d to 16f which cover the opaque portions 13d to 13f in areas occupied by the circuit patterns 10d to 10f when aligned with the first photomask 5a, and extending portions 15d to 15f overlapping the respective ends of the opaque portions 13d to 13f and extending outside the areas occupied by the circuit patterns 10d to 10f.

Figure 17A:
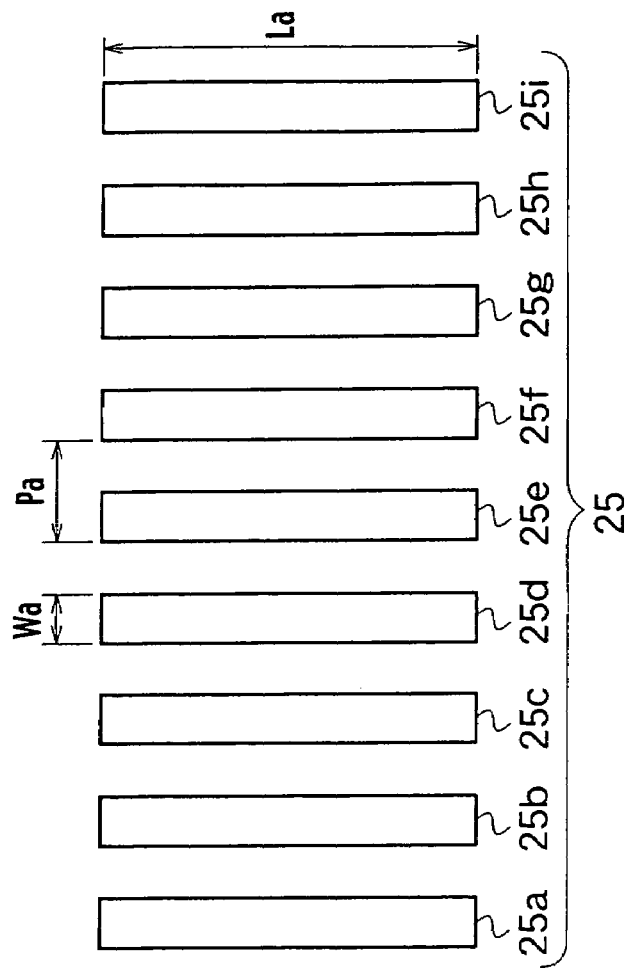
FIGS. 17A and 17B are schematic views showing an example of an alignment mark according to the second embodiment of the present invention.
Figure 17B:
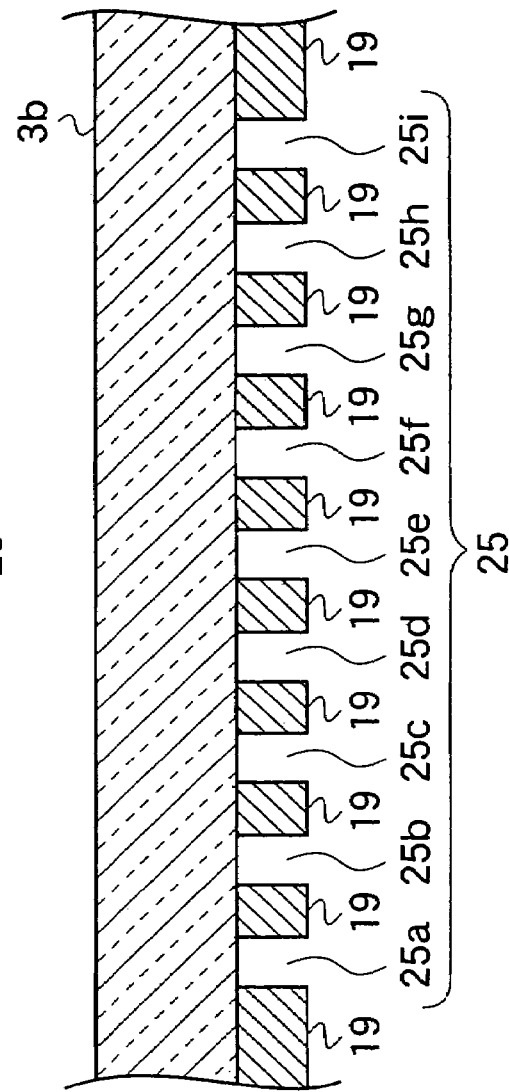

The alignment mark 25, as shown in the plan view of FIG. 17A and the cross-sectional view of FIG. 17B, has stripe-shaped opening portions 25a to 25i having, for example, a length La of 60 μm and a width Wa of 12 μm arranged at a pitch Pa of 24 μm on the opaque film 19 on the surface of a transparent substrate 3b. A resist pattern delineated by transferring the alignment mark 25 is detected by the aligner 50, so as to measure a displacement of the resist pattern caused by exposure conditions.

Next, the double exposure process of the second embodiment of the present invention will be described using a projected image corresponding to the line D-D of FIG. 15 as an example, with reference to the cross-sectional views in FIGS. 18 to 22.

Figure 18:
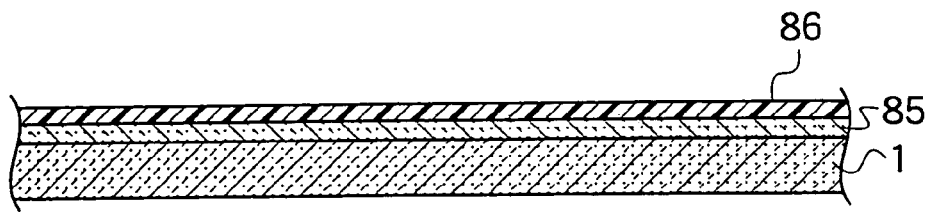
FIGS. 18 to 22 are examples of the cross-sectional views for explaining the double exposure process according to the second embodiment of the present invention.

(a) First, as shown in FIG. 18, an underlying film 85 made of, for example, a polysilicon is deposited on a semiconductor substrate 1 to have a thickness of 200 nm, and a first positive-type photoresist film 86 is spin-coated on the underlying film 85 to have a thickness of 600 nm.

Figure 19:
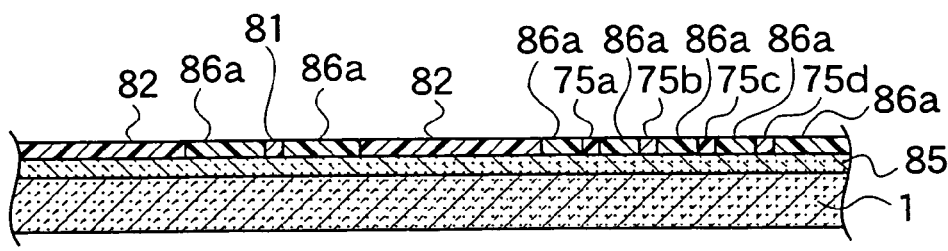

(b) In a first exposure step of the double exposure process, a pattern of the first photomask 5a is projected onto the photoresist film 86 on the surface of the semiconductor substrate 1 using the aligner 50 (see FIG. 4). As shown in FIG. 19, the circuit pattern 10d having the first and second openings 11d and 12d provided adjacent to each other sandwiching the first opaque portion 13d in FIG. 15 is exposed, and a wiring resist latent image 81 is delineated sandwiched by exposed resist films 86a between unexposed resist portions 82. Furthermore, the opening portions 25a to 25i of the alignment mark 25 shown in FIGS. 17A and 17B are exposed, and alignment resist latent images 75a to 75d, corresponding to the opaque film 19 between the respective opening portions 25a to 25i, are delineated.

Figure 20:
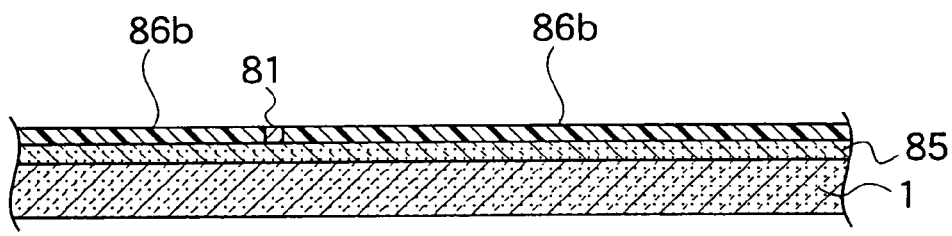

(c) Next, in the second exposure step, a pattern of the second photomask 6a is projected using the aligner 50 by detecting the alignment resist latent images 75a to 75d. When aligned with the transferred patterns of the first photomask 5a, the entire surface is exposed except the wiring resist latent image 81, which was transferred by the first opaque portion 13, shielded by the trim pattern 14d having the second opaque portion 16d and the extending portion 15d overlapping one end of the first opaque portion 13d and extending outside the area occupied by the circuit pattern 10d. Thus, an exposed resist film 86b is delineated as shown in FIG. 20.

Figure 21:
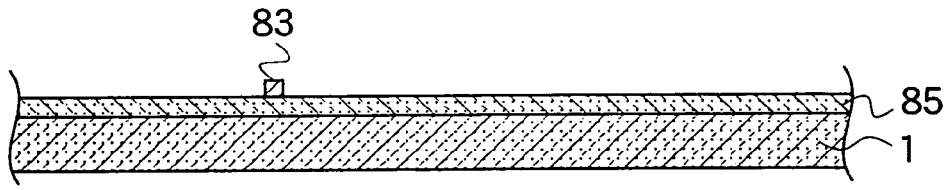

(d) After a development process, as shown in FIG. 21, the wiring resist latent image 81 is left on the underlying film 85 to delineate a wiring resist mask 83.

Figure 22:
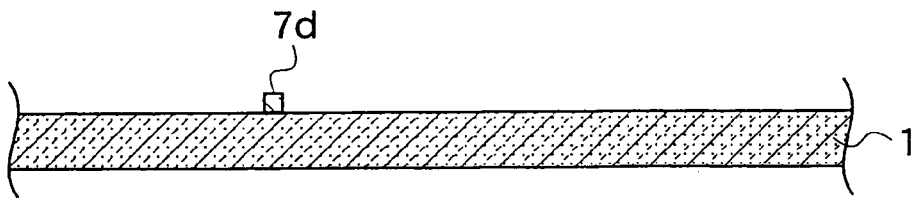

(e) Thereafter, the underlying film 85 is selectively removed by RIE using the wiring resist mask 83 as a mask. A narrow line portion 7d is delineated on the semiconductor substrate 1 as shown in FIG. 22.

Figure 23:
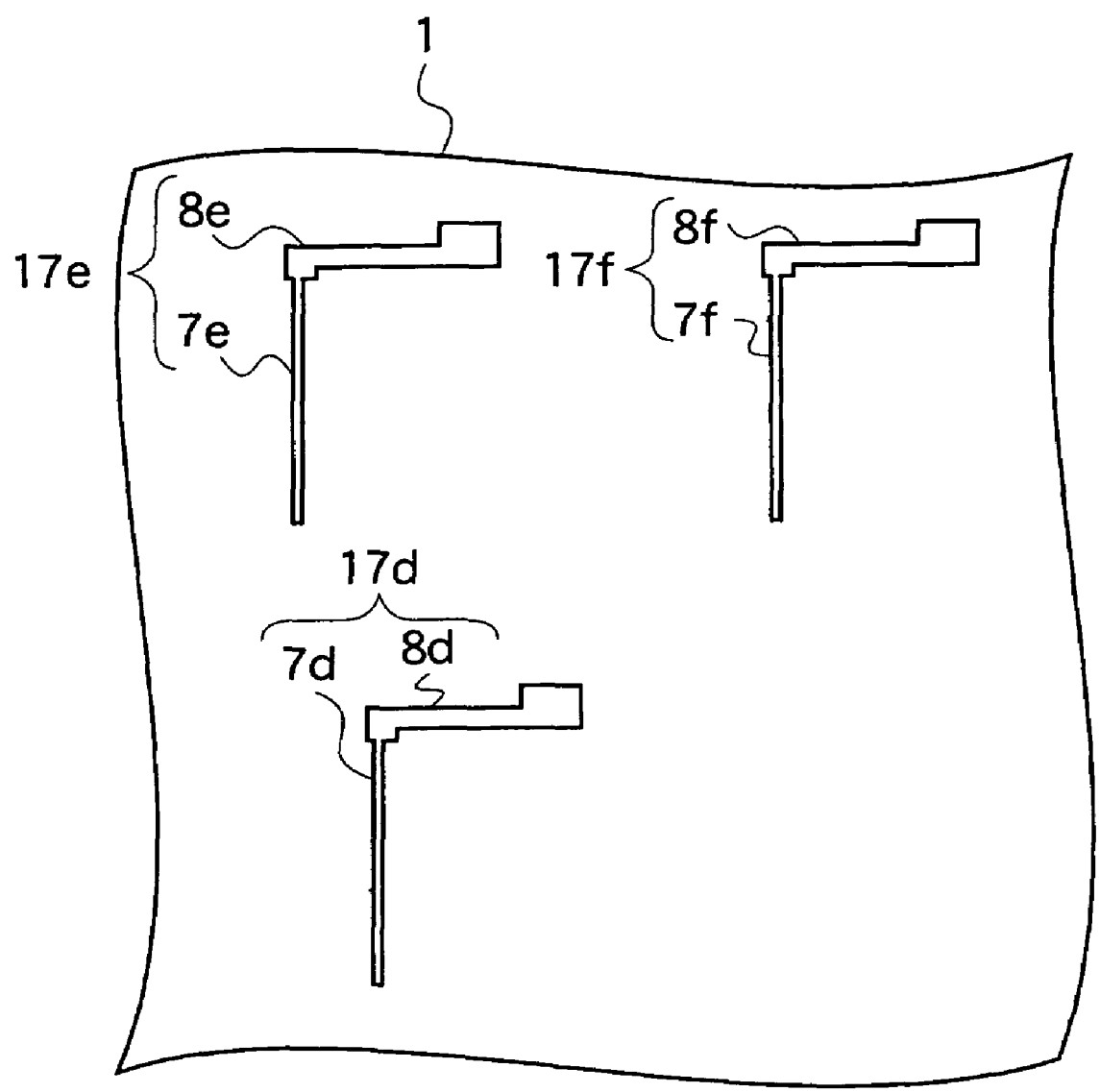
FIG. 23 is a schematic view showing an example of a wiring pattern formed by the double exposure process according to the second embodiment of the present invention.

By the above-mentioned double exposure process, as shown in FIG. 23, wirings 17d to 17f respectively having the narrow line portions 7d to 7f and wiring extending portions 8d to 8f corresponding to the extending portions 15d to 15f of the trim patterns 14d to 14f are delineated on the semiconductor substrate 1. Since the alignment resist latent images 75a to 75d delineated by transferring the opening portions 25a to 25i of the alignment mark 25 provided on the first photomask 5a are exposed in the second exposure step and removed in the development process, the alignment mark 25 can be provided in an area where another circuit pattern is scheduled to be printed in a later process.

In the monitoring method using the double exposure process according to the second embodiment of the present invention, in the first exposure step, the depolymerized exposed resist films 86a exposed through the opening portions 25a to 25i of the alignment mark 25 and the polymerized alignment resist latent images 75a to 75d are shielded from the light by the opaque film 19. The alignment resist latent images 75a to 75d can be optically detected because of differences in film thickness and optical characteristics such as the refraction index from the exposed resist films 86a. Immediately after the first exposure step, the alignment resist latent images 75a to 75d formed on the semiconductor substrate 1 using the first photomask 5a can be directly detected by the aligner 50, and displacements of the transferred alignment resist latent images 75a to 75d can be measured. Because the alignment mark 25 is provided also in an area where another circuit pattern is scheduled to be printed on the semiconductor substrate 1 in a later process, the deviations can be measured in detail, so that the distortion of the exposure area on the semiconductor substrate 1 can be inspected. In the second embodiment of the present invention, the alignment mark 25 is used as a monitor mark. However, it may be possible to provide another monitor mark on the first photomask 5a, such as an exposure monitor mark for measuring an exposure condition using a monitor resist latent image delineated on a photoresist film in the first exposure step.

As described above, according to the second embodiment of the present invention, on the first photomask 5a, a large number of the exposure monitor marks can be provided over the entire exposure area near the circuit patterns 10d to 10f with no restriction on layout. Thereby, detailed information on positions and dimensions over the entire exposure area where the semiconductor devices are fabricated can be provided, so that exposure conditions can be controlled with high accuracy in the double exposure process.

Third Embodiment

A method for inspecting a reticle set for the double exposure according to a third embodiment of the present invention is characterized in that a reticle set is easily fabricated and controlled with high accuracy by providing a monitor mark for inspecting a photomask on a first photomask used in the first exposure step. The rest of the method is the same as the first and second embodiments, and thus duplicated description is omitted.

Figure 24A:
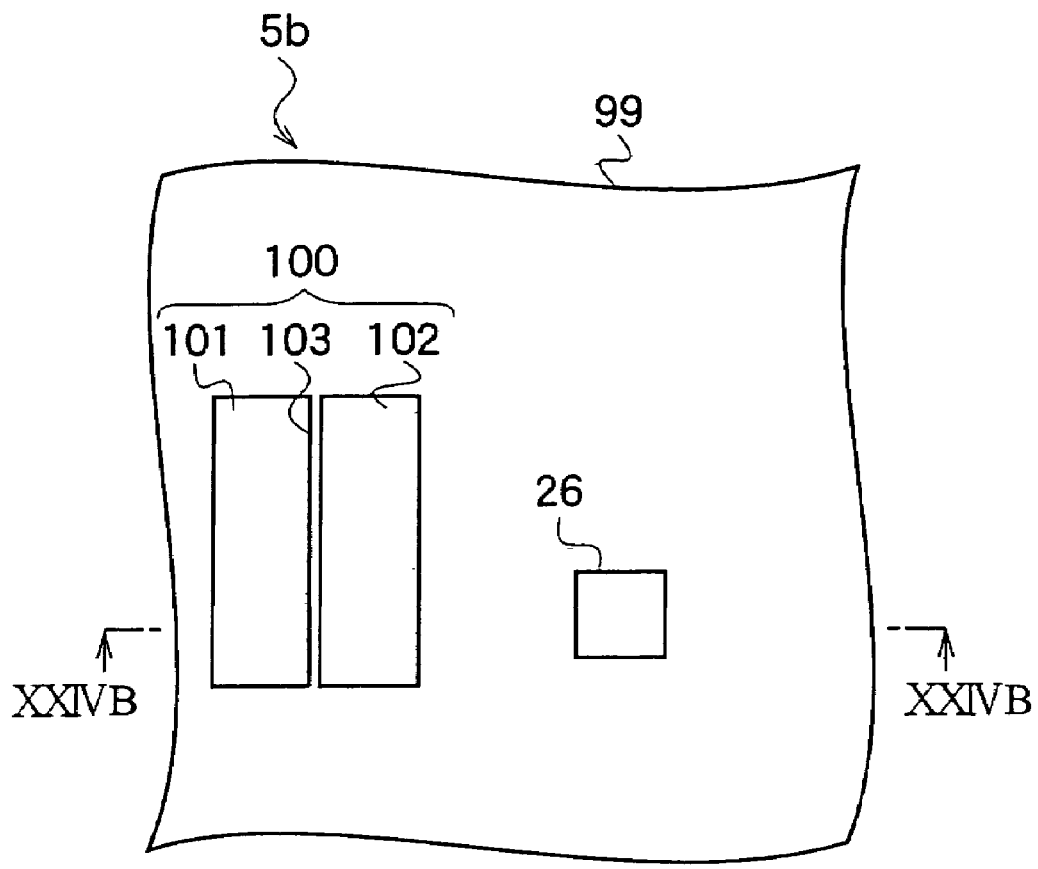
FIGS. 24A and 24B are schematic views showing an example of a first photomask according to a third embodiment of the present invention.

A first photomask 5b according to the third embodiment of the present invention, as shown in FIG. 24A, includes a circuit pattern 100 of an alternating phase shift mask, a phase shift monitor mark 26 for inspecting, for example, a photomask, and the like, which are arranged thereon. The circuit pattern 100 has a first opening 101 and a second opening 102 provided in an opaque film 99 and has a first linear opaque portion 103 between the first and second openings 101 and 102.

Figure 24B:
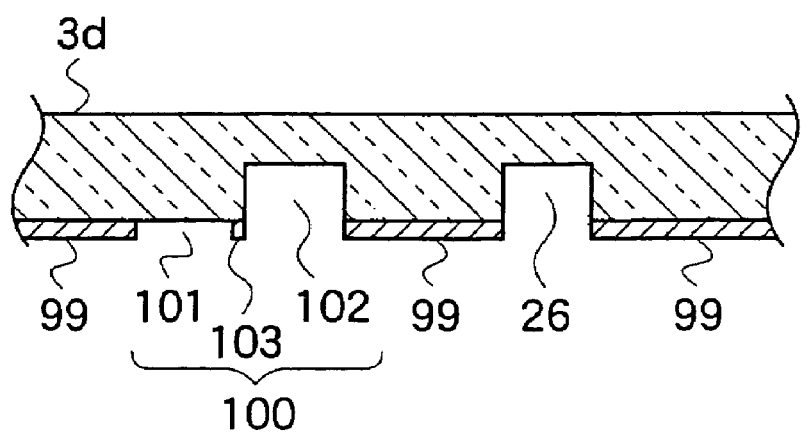

As shown in the cross-sectional view of FIG. 24B, which is taken along the line XXVB-XXVB of the photomask 5b in FIG. 24A, in the circuit pattern 100 for example, in the second opening 102, a trench is formed through the opaque film 99 into the transparent substrate 3. The second opening 102 shifts the phase by 180° relative to exposure light passing through the first opening 101. Hence, when the first opaque portion 103 is transferred onto a semiconductor substrate by the exposure light passing through the first and second openings 101 and 102, diffracted light under the opaque portion 103 is canceled out, and thereby the circuit pattern 100 is resolved on the semiconductor substrate 1. Positioned near the circuit pattern 100, for example, the phase shift monitor mark 26 having a trench with a square pattern with a length of each side of the square being 4 μm is formed through the opaque film 99 into the transparent substrate 3.

Figure 25:
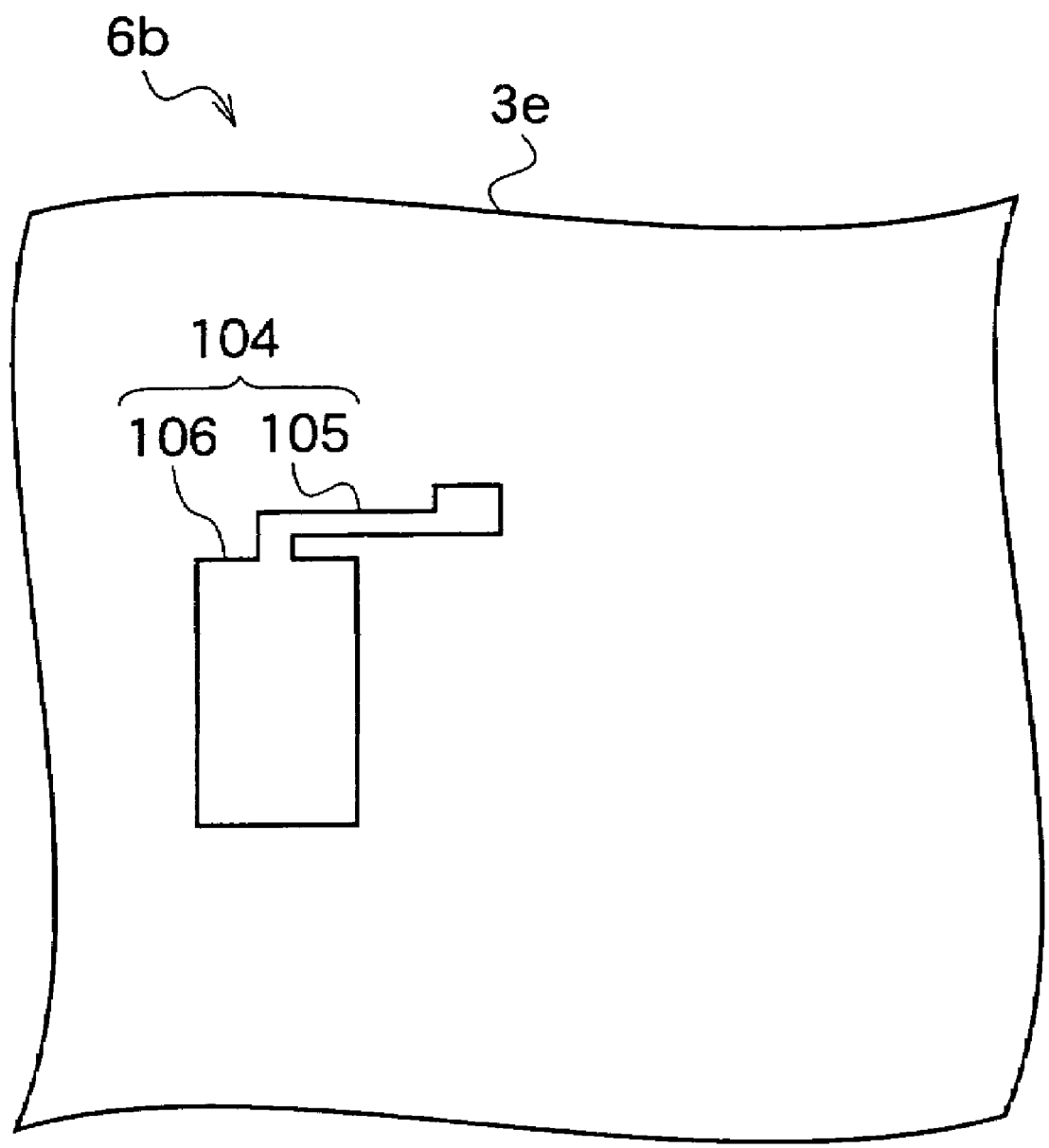
FIG. 25 is a schematic view showing an example of a second photomask according to the third embodiment of the present invention.

The second photomask 6b used in the second exposure step, as shown in FIG. 25, has a trim pattern 104 made of a opaque material film provided on the surface of a transparent substrate 3e. The trim pattern 104 has a second opaque portion 106 covering the first opaque portion 103 in an area occupied by the circuit pattern 100 when aligned with the first photomask 5b, and an extending portion overlapping one end of the first opaque portion 103 and extending outside the area occupied by the circuit pattern 100.

Figure 26A:
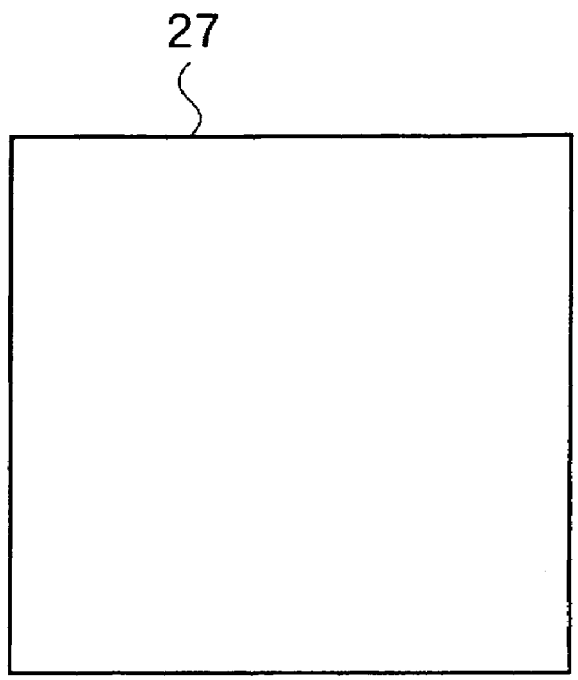
FIGS. 26A and 26B are schematic views showing an example of a transmittance monitor mark according to the third embodiment of the present invention.
Figure 26B:
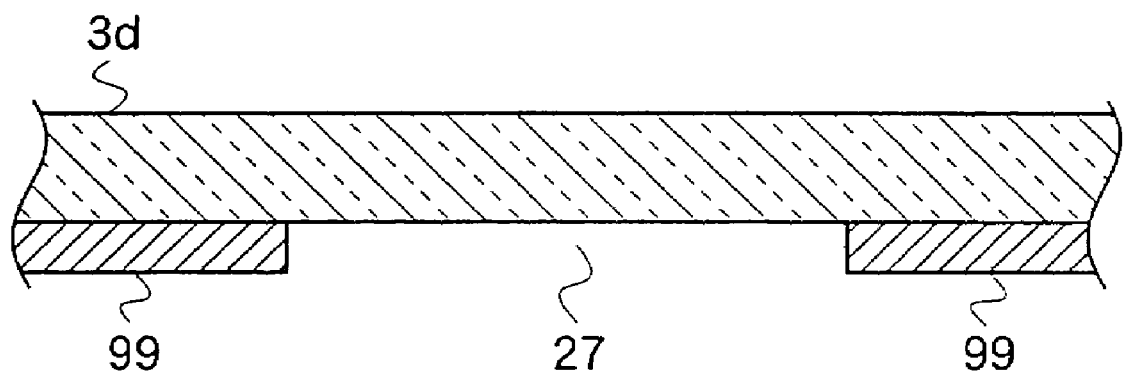

The phase shift monitor mark 26, for example, as in the second opening 102, has the trench formed into the transparent substrate 3 so as to shift a phase by 180 degrees relative to the exposure light passing through the first opening portion 101. By measuring the phase of light passing through the phase shift monitor mark 26, the distribution of variations in phase in the first photomask 5b can be measured. Furthermore, for example, the dimension monitor mark 21 in FIG. 5, a transmittance monitor mark 27 in FIG. 26A, and the like are disposed as a monitor mark for inspecting a photomask. The transmittance monitor mark 27, as shown in FIG. 26B, has a square opening in the opaque film 99 with each side having a length of 75 μm to measure the transmittance of a transparent substrate 3d to the exposure light.

In the first photomask 5b according to the third embodiment of the present invention, the inspection monitor marks for a photomask, such as the phase shift monitor mark 26 are provided adjacent to the circuit pattern 100 of the first photomask 5b and the trim pattern 104 of the second photomask 6b without overlapping, in an area of the monitor marks including an area where another circuit pattern is to be placed in a later process. A pattern of the inspection monitor marks for a photomask transferred by shielding the exposure light by the first photomask 5b in the first exposure step is exposed through the second photomask 6b in the second exposure step. Therefore, only the transferred pattern of the circuit pattern 100 shielded by the trim pattern 104 of the second photomask 6b in the second exposure step is left. Therefore, on the first photomask 5b, a large number of inspection monitor marks for a photomask can be provided over the entire exposure area near the circuit pattern 100 with no restriction on layout of the circuit pattern. Thereby, detailed information on positions and dimensions information on the entire exposure area where the circuit pattern 100 is arranged can be acquired, so that the first photomask 5b, for highly accurately controlling exposure conditions in the double exposure process, can be accurately fabricated and controlled.

Next, the method of producing the first photomask 5b according to the third embodiment of the present invention will be described with reference to the cross sectional views of FIGS. 27 to 32.

(a) First, as shown in FIG. 27, a first resist film 91 is spin-coated on an opaque material film 98, such as a metal film of Cr and the like, deposited on the transparent substrate 3d made of synthetic quartz and the like.

(b) By use of an electron beam lithography system and the like, a circuit pattern of the first photomask 5b is delineated on the first resist film 91 according to pattern data. After a development process, as shown in FIG. 28, a first resist mask 91a corresponding to the circuit pattern of the first photomask 5b is delineated.

(c) Using the first resist mask 91a as a mask, the opaque material film 98 is selectively removed by RIE and the like, as shown in FIG. 29, to delineate the first opaque portion 103 sandwiched by the first opening 101 and an etching window 102a, an etching window 26a and the transmittance monitor mark 27 in an opaque film 99.

(d) On the opaque film 99, on the transparent substrate 3d as shown in FIG. 30, a second resist film 92 is coated.

(e) By use of an electron beam lithography system and the like, opening patterns on the etching windows 102a and 26a are delineated on the first resist film 91 according to pattern data. After a development process, as shown in FIG. 31, a second resist mask 92a is delineated revealing the etching windows 102a and 26a expose.

(f) Thereafter, using the second resist mask 92a as a mask, the transparent substrate 3d is selectively removed by RIE, etc., to delineate the second opening 102 and the phase shift monitor mark 26, in the transparent substrate 3d to a depth such that the phase of the exposure light is shifted by 180 degrees as shown in FIG. 32.

Figure 33:
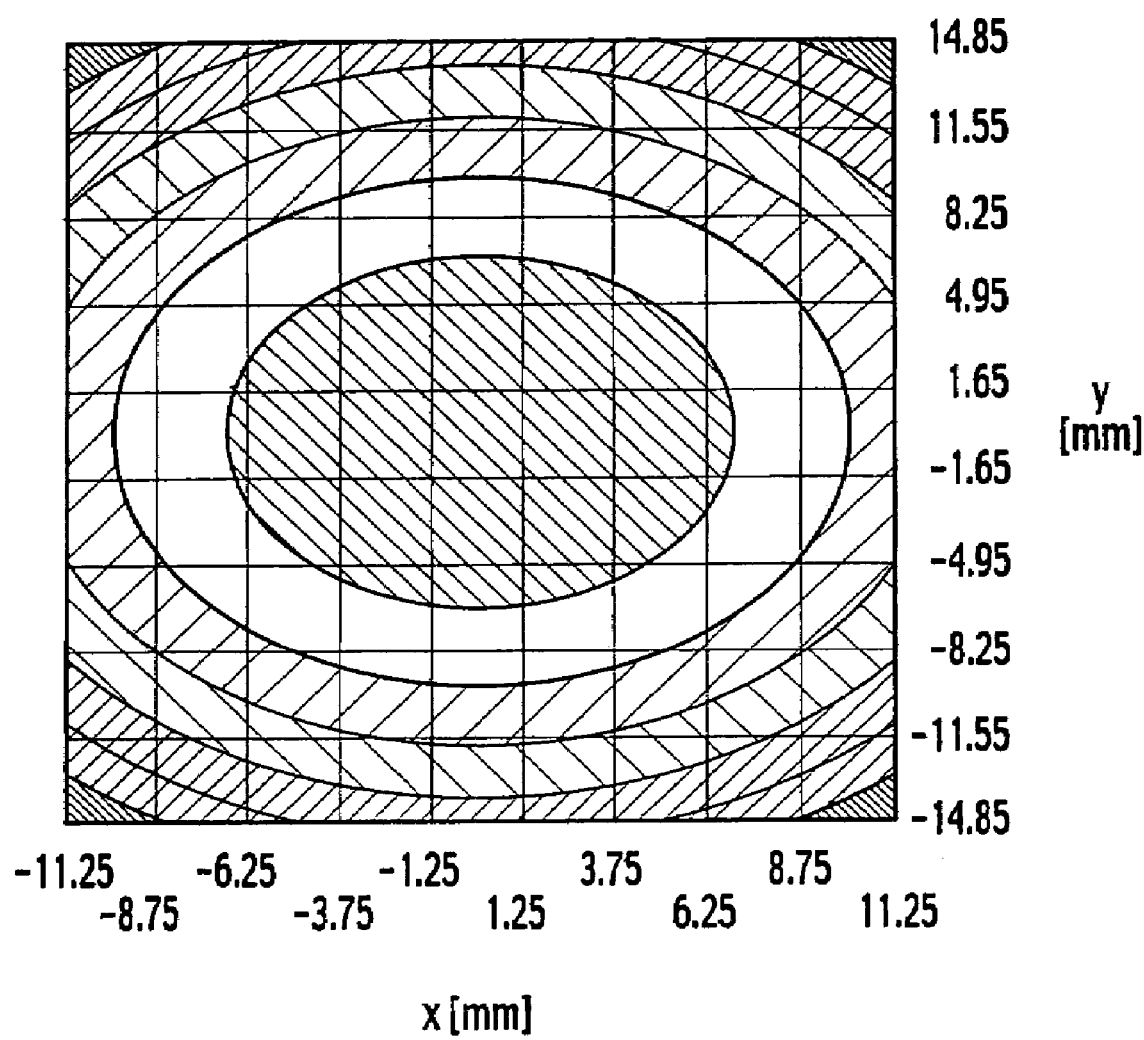
FIG. 33 is a graph showing an example of a distribution of a phase shift of the first photomask according to the third embodiment of the present invention.

The phase and transmittance of a transmitted light are measured by an optical inspection apparatus using the inspection monitor marks for a photomask, such as the phase shift monitor mark 26 and the transmittance monitor mark 27 of the first photomask 5b fabricated in the above manner. Since the inspection monitor marks for a photomask can be provided over the entire surface of the first photomask 5b, detailed control for the fabricated photomask is possible. It has been determined that, for example, the phase shift of the transmitted light measured with the phase shift monitor mark 26 has a concentric distribution, as shown in FIG. 33, in the surface of the first photomask 5b having an area of 23 by 30 mm square. The concentric distribution of phase shift reflects the distribution of etched depth of the trenches in the transparent substrate 3d by RIE. This result is fed back into RIE etching conditions, so that an alternating phase shift mask decreasing a phase shift distribution can be fabricated.

According to the third embodiment of the present invention, on the first photomask 5b, a large number of the inspection monitor marks for a photomask can be provided over the entire exposure area near the circuit pattern 100 with no restriction on layout of the circuit pattern. Thereby, detailed information on positions and dimensions over the entire exposure area where the circuit pattern 100 is provided can be acquired, so that the first photomask 5b for highly accurately controlling exposure conditions in the double exposure process can be accurately fabricated and controlled.

Other Embodiments

In the first to third embodiments of the present invention, the reticle 4 is either the first photomask or the second photomask. For example, the reticle set may be a reticle set where the first and second photomasks are provided respectively in two divided areas of the reticle 4. Alternatively, the reticle set may be provided by the first and second photomasks respectively on individual transparent substrates as the reticle 4.

In the first and second embodiments of the present invention, a KrF excimer laser reduction projection aligner is used for the sake of convenience in the description. However, an ultraviolet light such as an i-line or g-line, another excimer, an electron beam, an X-ray, or the like can be used as a light source, as a matter of course.

Various modifications will become possible for those skilled in the art after receiving the teachings of the present disclosure without departing from the scope thereof.

What is claimed is:

1. An exposure monitoring method, comprising:
    delineating a wiring resist mask of a photoresist film by transferring a narrow line portion of a wiring of a circuit by a first exposure step;
    delineating a monitor resist pattern of the photoresist film by transferring an exposure monitor mark configured to measure an exposure condition provided over an entire area where the wiring resist mask is delineated, the monitor resist pattern provided at a position where another wiring resist mask is configured to be delineated in a later process, the position being exposed by a second exposure step so that the monitor resist pattern is configured to be removed after the second exposure step; and
    measuring the exposure condition for the first exposure step by the monitor resist pattern.

2. The exposure monitoring method of claim 1 wherein the delineating of the monitor resist pattern includes development of the photoresist film.

3. The exposure monitoring method of claim 1, wherein the monitor resist pattern is a monitor resist latent image formed by exposing the photoresist film.

4. The exposure monitoring method of claim 1, wherein the exposure condition is measured from the monitor resist pattern formed by transferring at least one of a dimension monitor mark configured to monitor a dimension of a transferred pattern, an exposure dose monitor mark configured to monitor an exposure dose, and an alignment mark configured to monitor a displacement of the transferred pattern.

5. An inspection method for a reticle set, comprising:
    delineating a circuit pattern and an inspection monitor mark on a resist film coated on an opaque material film on a transparent substrate to form a resist mark;
    etching the opaque material film by use of the resist mark to form a first photomask in which the circuit pattern has first and second openings provided adjacent to each other sandwiching a first opaque portion, and the inspection monitor mark provided over an entire area where the circuit pattern is formed, the inspection monitor mark provided at a corresponding position where another circuit pattern is configured to be printed on a semiconductor substrate in a later process; and
    inspecting the first photomask by use of the inspection monitor mark.

6. The inspection method of claim 5, further comprising, placing the inspection monitor mark at such a position on the first photomask that an area where the inspection monitor mark is transferred on a substrate is exposed by a light through a second photomask.

7. The inspection method of claim 5, further comprising, performing the inspection of the first photomask using at least one of a phase shift monitor mark configured to inspect a phase shift of a transmitting exposure light, a transmittance monitor mark configured to inspect a transmittance of the exposure light, and a dimension monitor mark configured to inspect a dimension of a transferred pattern on a substrate.

* * * * *